United States Patent
Kim et al.

(10) Patent No.: US 9,673,276 B2
(45) Date of Patent: Jun. 6, 2017

(54) SEMICONDUCTOR DEVICE AND METHOD OF FABRICATING THE SAME

(71) Applicant: Samsung Electronics Co., Ltd., Suwon-si (KR)

(72) Inventors: Junsoo Kim, Anyang-si (KR); Dongjin Lee, Seoul (KR); Dongsoo Woo, Seoul (KR); Jun-Bum Lee, Seoul (KR); Sang-Il Han, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/194,066

(22) Filed: Jun. 27, 2016

(65) Prior Publication Data
US 2016/0308000 A1 Oct. 20, 2016

Related U.S. Application Data

(63) Continuation of application No. 14/834,465, filed on Aug. 25, 2015, now Pat. No. 9,443,930.

(30) Foreign Application Priority Data

Sep. 19, 2014 (KR) .......................... 10-2014-0125090

(51) Int. Cl.
*H01L 29/06* (2006.01)
*H01L 29/49* (2006.01)
(Continued)

(52) U.S. Cl.
CPC ........ *H01L 29/0653* (2013.01); *H01L 27/088* (2013.01); *H01L 27/10805* (2013.01);
(Continued)

(58) Field of Classification Search
CPC ........... H01L 29/0653; H01L 27/10805; H01L 29/517; H01L 29/513; H01L 29/4966;
(Continued)

(56) References Cited

U.S. PATENT DOCUMENTS

| | | | |
|---|---|---|---|
| 7,354,822 B2 | 4/2008 | Chen et al. | |
| 7,741,217 B2 | 6/2010 | Yang et al. | |
| 8,530,962 B2 * | 9/2013 | Jang ...................... | H01L 21/265 257/331 |
| 8,901,630 B2 | 12/2014 | Huh et al. | |
| 2005/0051856 A1* | 3/2005 | Ono ................... | H01L 21/28079 257/411 |
| 2006/0063319 A1* | 3/2006 | Ono ................... | H01L 29/42384 438/197 |
| 2006/0239083 A1 | 10/2006 | Lee | |
| 2007/0158780 A1* | 7/2007 | Chang ............... | H01L 21/76229 257/500 |
| 2009/0011608 A1* | 1/2009 | Nabatame ......... | H01L 21/28185 438/761 |
| 2009/0020845 A1 | 1/2009 | Shin et al. | |
| 2009/0203189 A1 | 8/2009 | Shin et al. | |
| 2011/0147837 A1 | 6/2011 | Hafez et al. | |
| 2012/0032257 A1 | 2/2012 | Ananthan et al. | |

(Continued)

FOREIGN PATENT DOCUMENTS

| KR | 10-2009-0081615 A | 7/2009 |
|---|---|---|
| KR | 10-1194973 B1 | 10/2012 |
| KR | 10-2013-0110599 A | 10/2013 |

OTHER PUBLICATIONS

Koji Kita et al., "Intrinsic Origin of Electric Dipoles Formed at High-k/SiO2 Interface", Department of Materials Engineering, The University of Tokyo, pp. 1-4, Dec. 2008.

*Primary Examiner* — Karen Kusumakar
(74) *Attorney, Agent, or Firm* — Muir Patent Law, PLLC

(57) ABSTRACT

A semiconductor device may include a semiconductor substrate including an active region defined by a trench, a device isolation layer provided in the trench to surround the active region, a gate electrode extending in a direction crossing the active region, and formed on the active region and the device isolation layer, and a gate insulating layer between the active region and the gate electrode. The active region may have a first conductivity type, and the device isolation layer may include a first silicon oxide layer on an inner surface of the first trench and a different layer, selected from one of first metal oxide layer and a negatively-charged layer, on the first silicon oxide layer.

18 Claims, 29 Drawing Sheets

(51) Int. Cl.
  *H01L 29/51* (2006.01)
  *H01L 27/088* (2006.01)
  *H01L 27/108* (2006.01)
  *H01L 27/22* (2006.01)
  *H01L 27/24* (2006.01)

(52) U.S. Cl.
  CPC .. *H01L 27/10814* (2013.01); *H01L 27/10876* (2013.01); *H01L 27/10885* (2013.01); *H01L 27/10891* (2013.01); *H01L 27/228* (2013.01); *H01L 29/4966* (2013.01); *H01L 29/513* (2013.01); *H01L 29/517* (2013.01); *H01L 27/2436* (2013.01)

(58) Field of Classification Search
  CPC .. H01L 27/088; H01L 27/228; H01L 27/2436
  See application file for complete search history.

(56) References Cited

U.S. PATENT DOCUMENTS

| | | |
|---|---|---|
| 2012/0146124 A1 | 6/2012 | Hafez et al. |
| 2012/0292711 A1* | 11/2012 | Zhao ............... H01L 21/823842 257/369 |
| 2013/0037888 A1 | 2/2013 | Han et al. |

* cited by examiner

SEMICONDUCTOR DEVICE AND METHOD OF FABRICATING THE SAME

CROSS-REFERENCE TO RELATED APPLICATIONS

This U.S. non-provisional patent application is a continuation of U.S. patent application Ser. No. 14/834,465, entitled "SEMICONDUCTOR DEVICE AND METHOD OF FABRICATING THE SAME," filed Aug. 25, 2015, which claims priority under 35 U.S.C. §119 to Korean Patent Application No. 10-2014-0125090, filed Sep. 19, 2014, in the Korean Intellectual Property Office, the entire contents of both of which are hereby incorporated by reference.

BACKGROUND OF THE INVENTION

Example embodiments of the inventive concept relate to a semiconductor device and a method of fabricating the same.

Due to their small-sized, multifunctional, and/or low-cost characteristics, semiconductor devices are being esteemed as important elements in the electronic industry. Higher integration of semiconductor devices, such as semiconductor memory devices, is useful to satisfy consumer demands for superior performance and inexpensive prices. In the case of semiconductor memory devices, increased integration is especially useful, because their integration is an important factor in determining product prices. However, the extremely expensive process equipment needed to increase pattern fineness sets a practical limitation on increasing integration for semiconductor memory devices. To overcome such a limitation, a variety of studies on new technology for increasing integration density of a semiconductor device are being performed.

SUMMARY

Example embodiments of the inventive concept provide a highly-reliable semiconductor device.

Other example embodiments of the inventive concept provide a method of fabricating a highly-reliable semiconductor device.

According to example embodiments of the inventive concept, a semiconductor device may include a semiconductor substrate including an active region defined by a trench, a device isolation layer provided in the trench to surround the active region, a gate electrode extending in a direction crossing the active region, and formed on the active region and the device isolation layer, and a gate insulating layer between the active region and the gate electrode. The active region may have a first conductivity type, and the device isolation layer may include a first silicon oxide layer on an inner surface of the first trench and a different layer, selected from one of a first metal oxide layer and an negatively-charged layer, on the first silicon oxide layer.

In example embodiments, the different layer may be a first metal oxide layer that has an area oxygen density higher than that of the first silicon oxide layer. In one embodiment, first metal oxide layer may contain Al, Ti, Zr, Hf, Ir, Ta, or Mg.

In example embodiments, the device isolation layer may further include a second silicon oxide layer on the first metal oxide layer, a silicon nitride layer on the second silicon oxide layer, and a third silicon oxide layer on the silicon nitride layer.

In example embodiments, the active region may be provided to have a second trench extending to the device isolation layer, and part of the gate electrode may be disposed in the second trench. The first metal oxide layer may be extended from a bottom surface of the first trench to a top surface of the active region. The first metal oxide layer may surround the active region.

In example embodiments, the gate electrode may include a first gate electrode and a second gate electrode crossing each active region. The device may include a first doped region formed between the first and second gate electrodes and in a central portion of the active region and second doped regions formed in edge portions of the active region. The first and second doped regions may have a second conductivity type. The second doped regions may be formed spaced apart from each other with the first and second gate electrodes interposed therebetween. The first doped region may have a bottom surface lower than that of the second doped region.

In example embodiments, the gate insulating layer may include a second silicon oxide layer and a second metal oxide layer on the second silicon oxide layer. The second metal oxide layer may have an area oxygen density lower than that of the second silicon oxide layer. The second metal oxide layer may contain La, Lu, Y, or Gd. The second metal oxide layer may extend between the gate electrode and the device isolation layer. The gate electrode may include a metal nitride layer in contact with the second metal oxide layer, and the metal nitride layer may include TiN or WN. The gate electrode further may include a W or TiAl layer provided on the metal nitride layer to fill a lower portion of the second trench.

In example embodiments, the different layer may be a negatively-charged layer that contains F or Cl.

According to example embodiments of the inventive concept, a semiconductor device may include a semiconductor substrate comprising an active region defined by a trench. The active region may have a first conductivity type. The device may further include a device isolation layer provided in the trench to surround the active region; a gate electrode, extending in a direction crossing the active region, and formed on the active region and the device isolation layer; and a gate insulating layer between the active region and the gate electrode, the gate insulating layer having electric dipoles. The device isolation layer may comprise an interface layer including a first silicon oxide layer conformally formed on an inner surface of the trench and a different layer, selected from one of a first metal oxide layer and a negatively-charged layer, on the first silicon oxide layer.

In one embodiment, the gate insulating layer comprises a first silicon oxide layer and a first metal oxide layer on the first silicon oxide layer, and the first metal oxide layer has an area oxygen density lower than that of the first silicon oxide layer.

In one embodiment, the gate insulating layer includes a first sub-layer that reduces an effective work function of the gate electrode and lowers the threshold voltage of the active region, and the interface layer includes a second sub-layer that counteracts the threshold voltage reduction of the gate insulating layer.

In one embodiment, the first sub-layer is a second metal oxide layer, and the second sub-layer is the first metal oxide layer.

According to example embodiments of the inventive concept, a semiconductor device may include a semiconductor substrate including an active region defined by a trench, a device isolation layer provided in the trench to surround the active region, a gate electrode extending in a direction crossing the active region, and formed on the active region and the device isolation layer, and a gate insulating layer between the active region and the gate electrode. The active region may have a first conductivity type. The gate insulating layer may include a first silicon oxide layer and a first metal oxide layer on the first silicon oxide layer, and the first metal oxide layer may have an area oxygen density lower than that of the first silicon oxide layer.

In example embodiments, the first metal oxide layer may contain La, Lu, Y, or Gd.

In example embodiments, the gate electrode may include a metal nitride layer in contact with the first metal oxide layer, and the metal nitride layer may include TiN or WN. The gate electrode may further include a W or TiAl layer provided on the metal nitride layer.

In example embodiments, the device isolation layer may include a second silicon oxide layer on an inner surface of the trench and a second metal oxide layer on the second silicon oxide layer, and the second metal oxide layer may have an area oxygen density higher than that of the second silicon oxide layer. The second metal oxide layer may contain Al, Ti, Zr, Hf, Ir, Ta, or Mg.

According to example embodiments of the inventive concept, a semiconductor device includes a semiconductor substrate comprising an active region defined by a trench, the active region having a first conductivity type, and a device isolation layer provided in the trench to surround the active region. The device isolation layer includes a device isolation filler layer and an interface layer between the active region and the device isolation filler layer. The device additionally includes a gate electrode extending in a direction crossing the active region, and formed on the active region and the device isolation layer, and a gate insulating layer between the active region and the gate electrode. The gate insulating layer may include a first sub-layer that reduces an effective work function of the gate electrode and lowers the threshold voltage of the active region, and the interface layer may include a second sub-layer that counteracts the threshold voltage reduction of the gate insulating layer.

In one embodiment, the first sub-layer is a first metal oxide layer, and the second sub-layer is a second metal oxide layer.

In one embodiment, the interface layer includes a silicon oxide layer between the active region and the second metal oxide layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5A through 14A are sectional views, which sequentially illustrate a process of fabricating a semiconductor device according to example embodiments of the inventive concept, and each of which is taken along a direction corresponding to line I-I' of FIG. 1.

FIGS. 5B through 14B are sectional views, which sequentially illustrate a process of fabricating a semiconductor device according to example embodiments of the inventive concept, and each of which is taken along a direction corresponding to line II-IP of FIG. 1.

FIGS. 5C through 14C are sectional views, which sequentially illustrate a process of fabricating a semiconductor device according to example embodiments of the inventive concept, and each of which is taken along a direction corresponding to line of FIG. 1.

Figure 1:
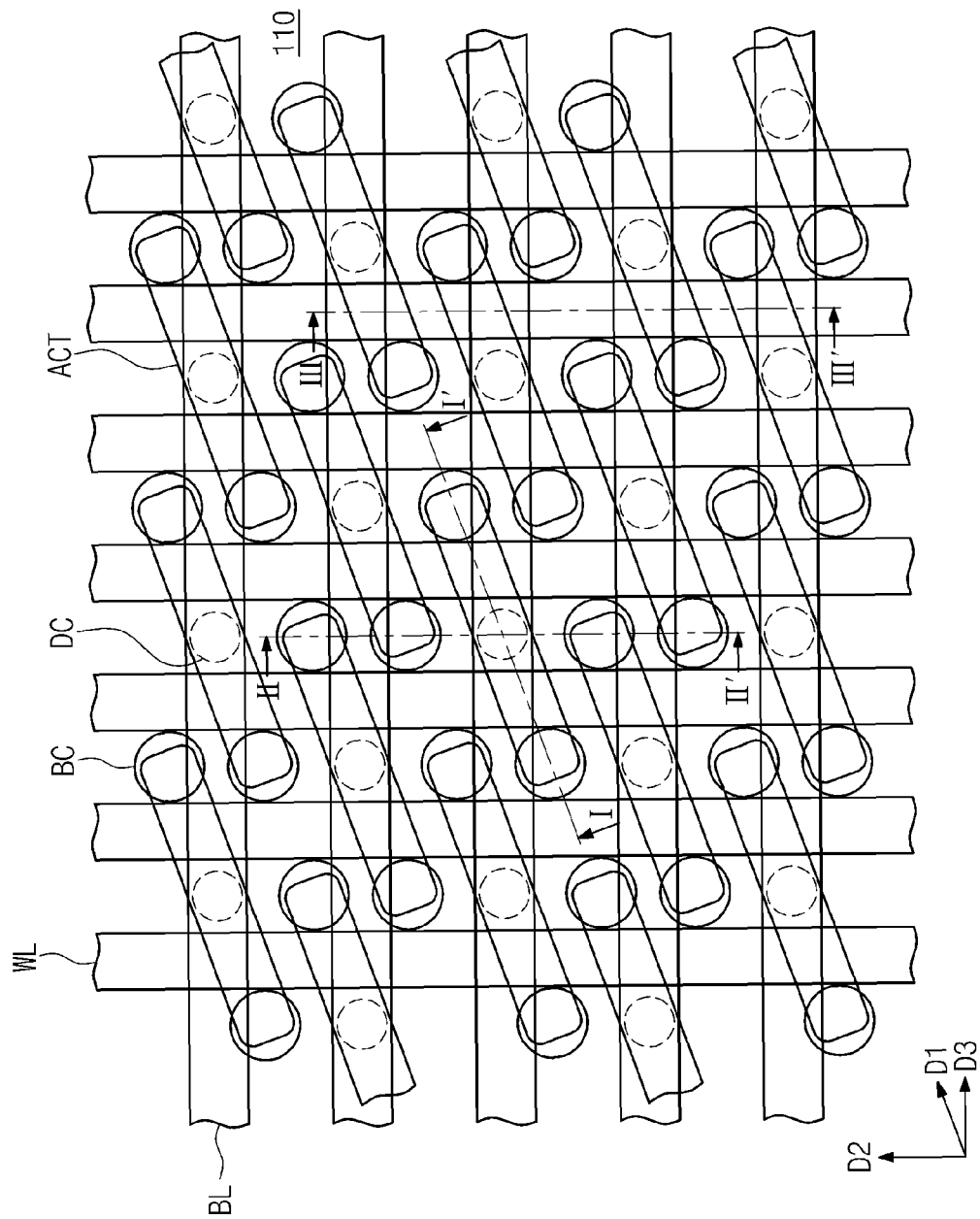
FIG. 1 is a layout diagram of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on").

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present disclosure. In addition, in certain cases, even if a term is not described using "first," "second," etc., in the specification, it may still be referred to as "first" or "second" in a claim in order to distinguish different claimed elements from each other Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
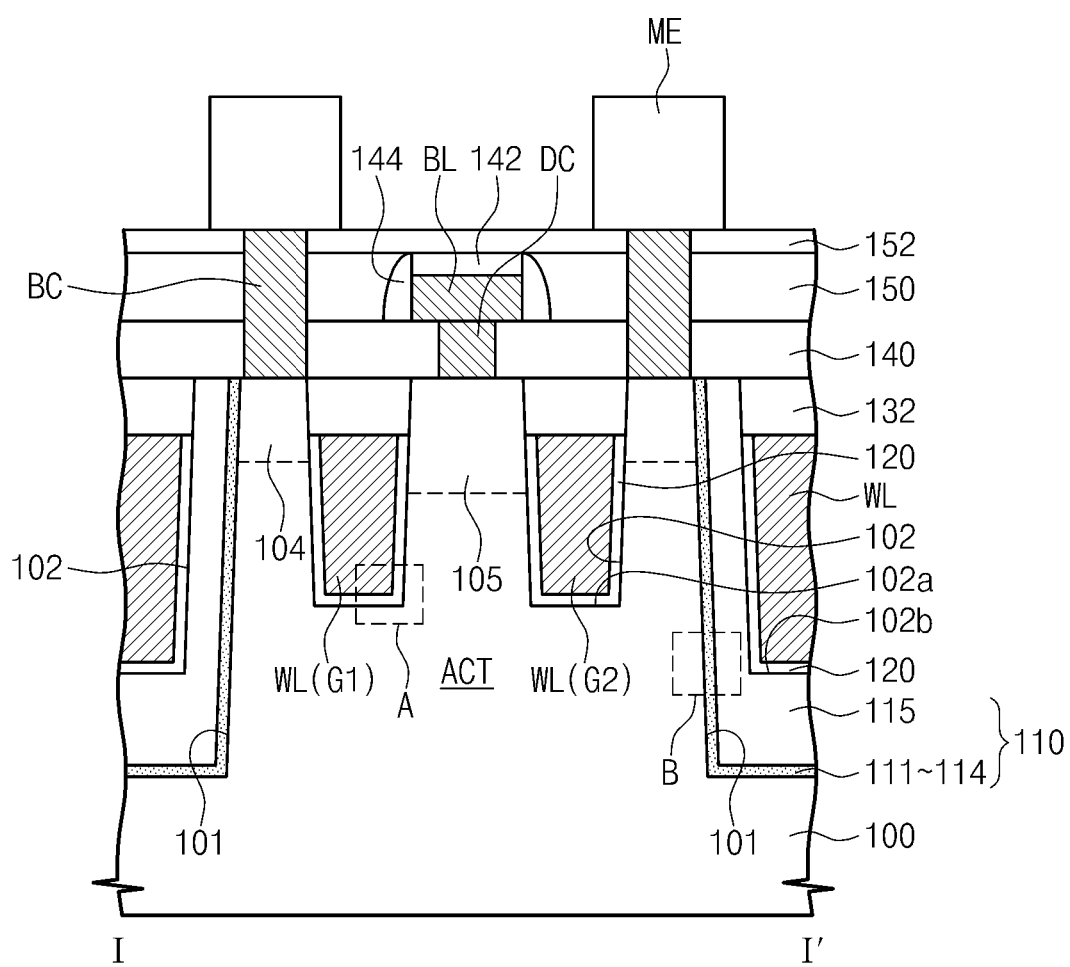
FIGS. 2A through 2C are sectional views illustrating a semiconductor device according to example embodiments of the inventive concept, taken along lines I-I', and respectively, of FIG. 1.
Figure 2B:
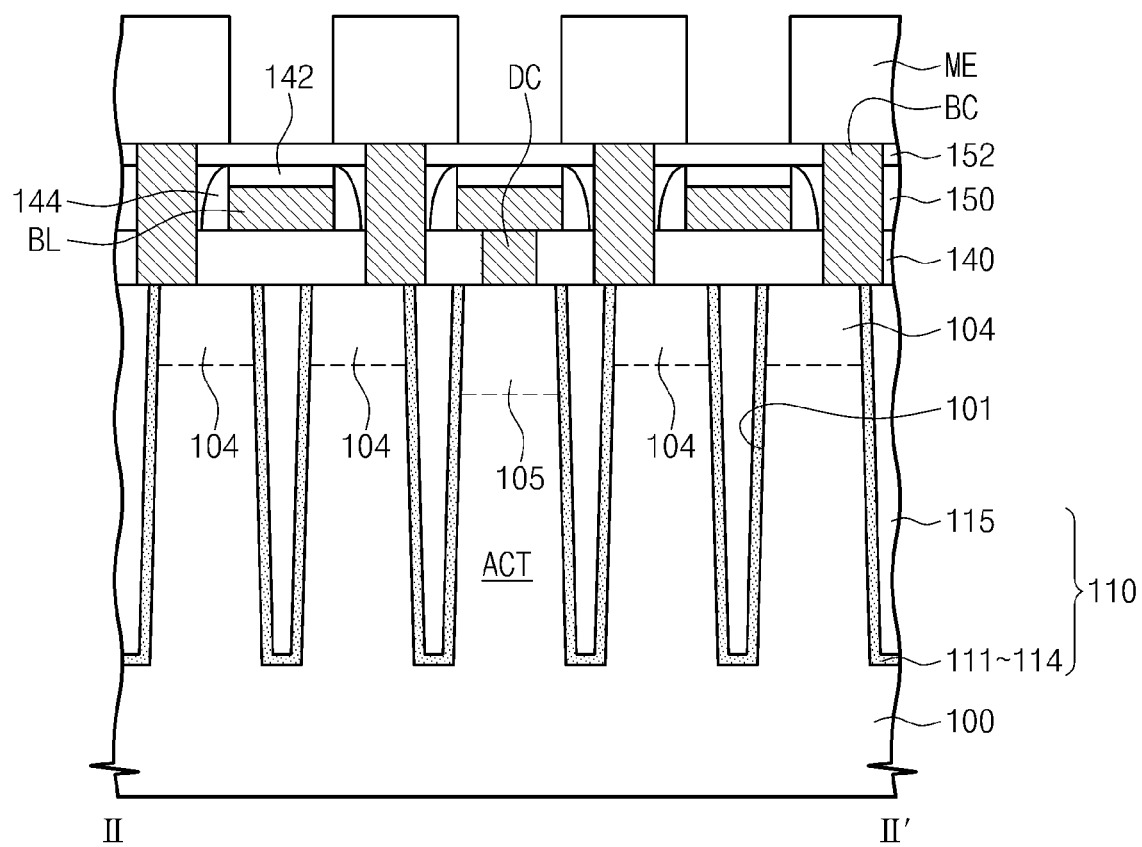
Figure 2C:
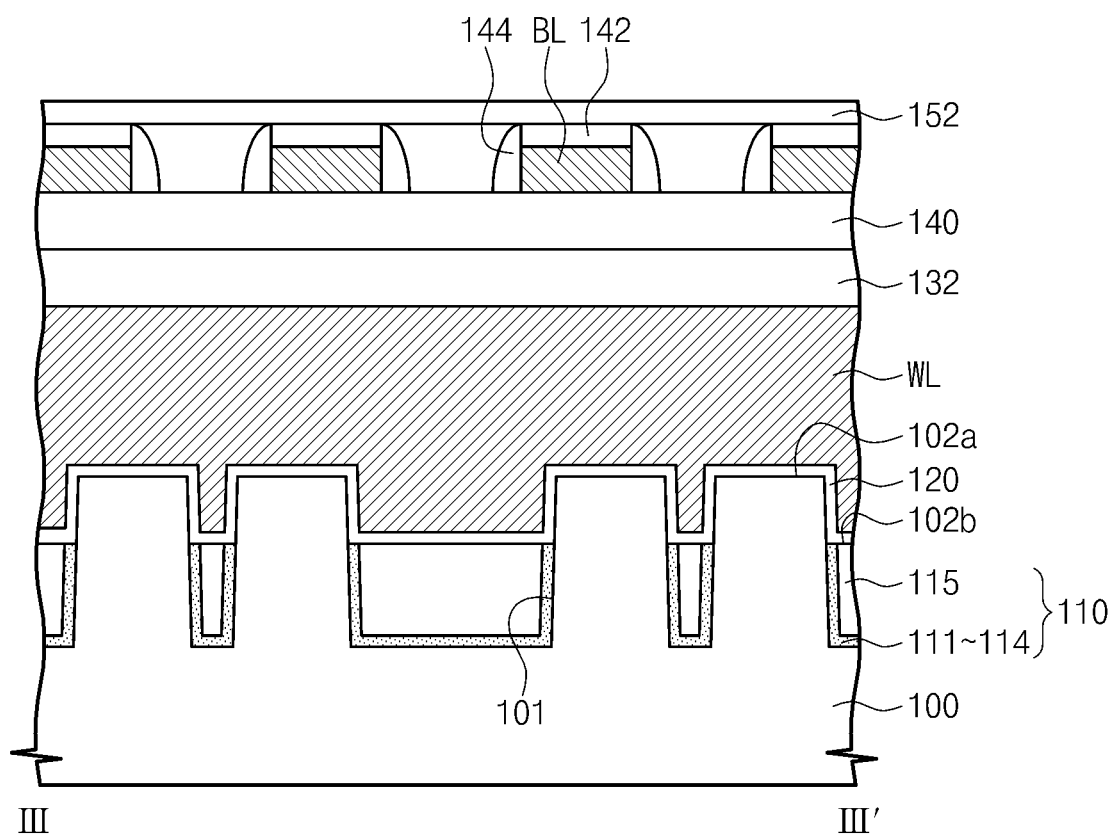
Figure 3:
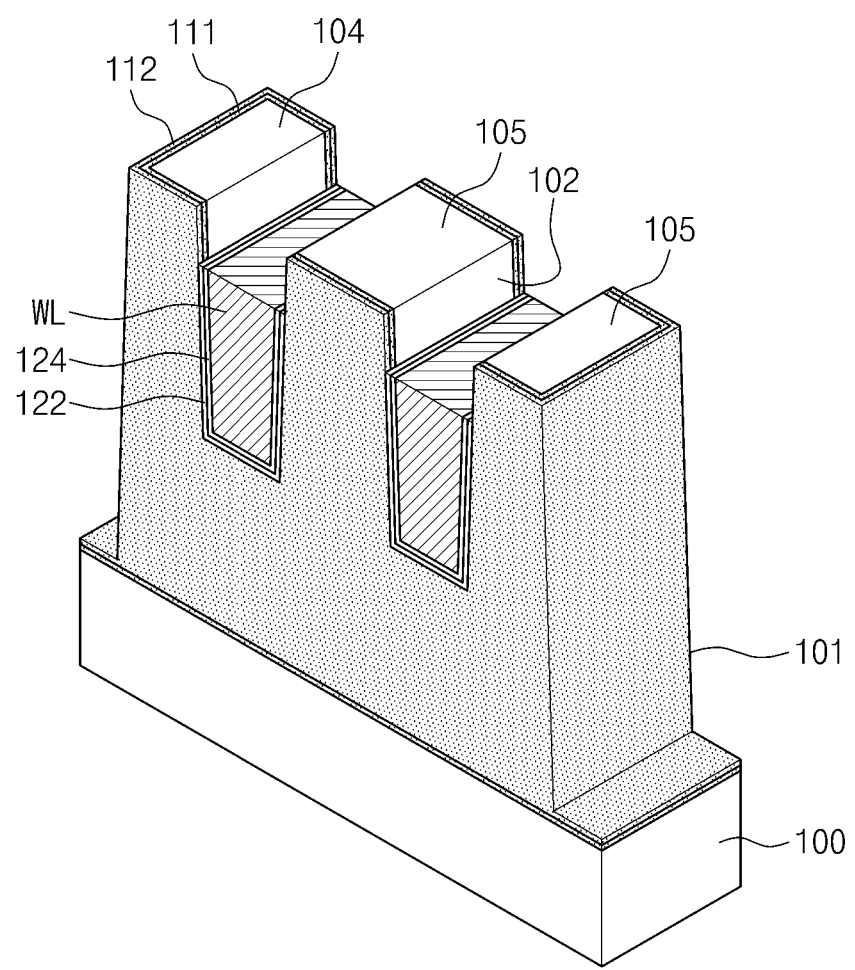
FIG. 3 is a perspective view illustrating active and its neighboring regions of a semiconductor device according to example embodiments of the inventive concept.
Figure 4A:
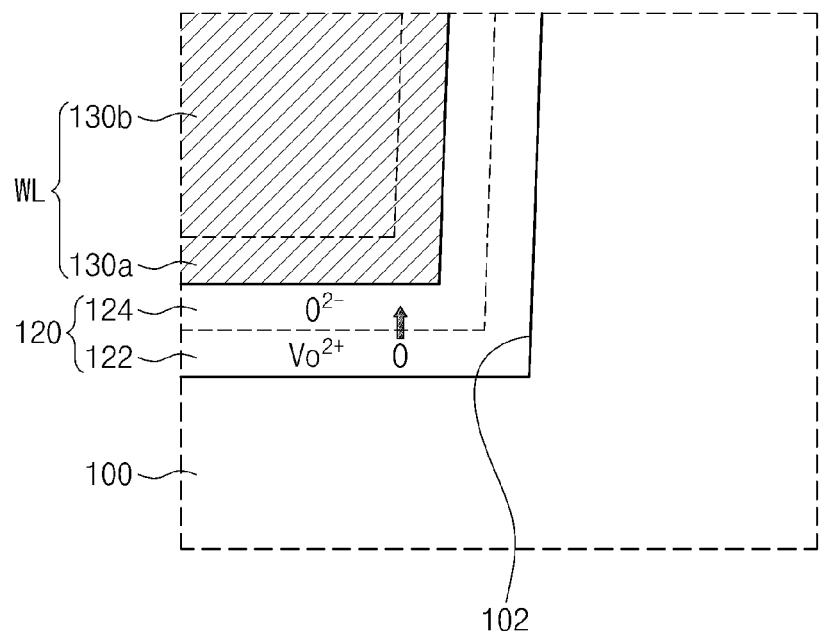
FIG. 4A is an enlarged view of a portion A of FIG. 2A.
Figure 4B:
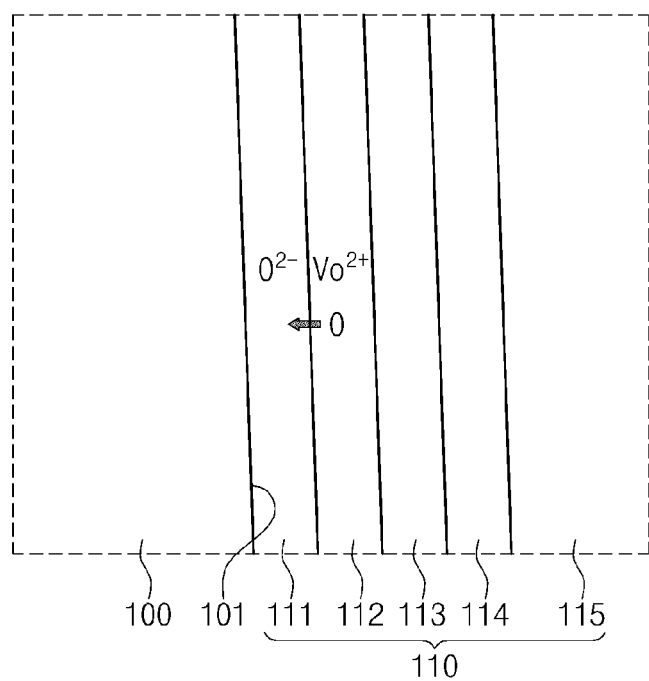
FIG. 4B is an enlarged view of a portion B of FIG. 2A.
Figure 5A:
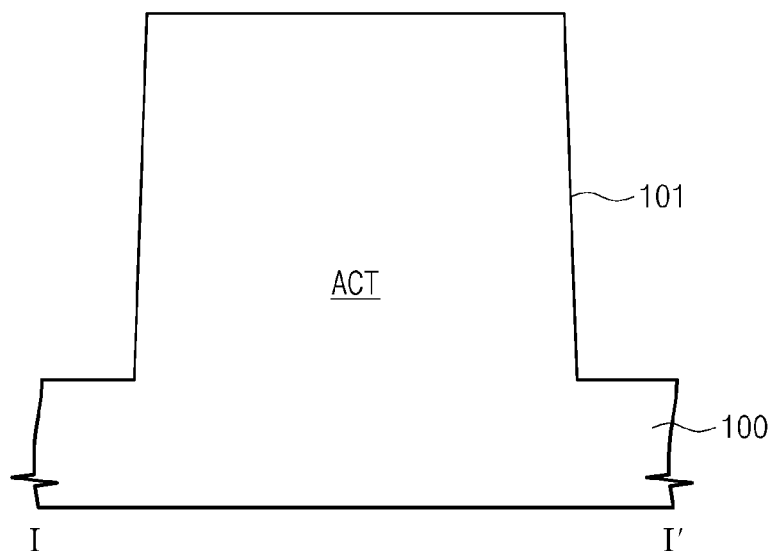
Figure 5B:
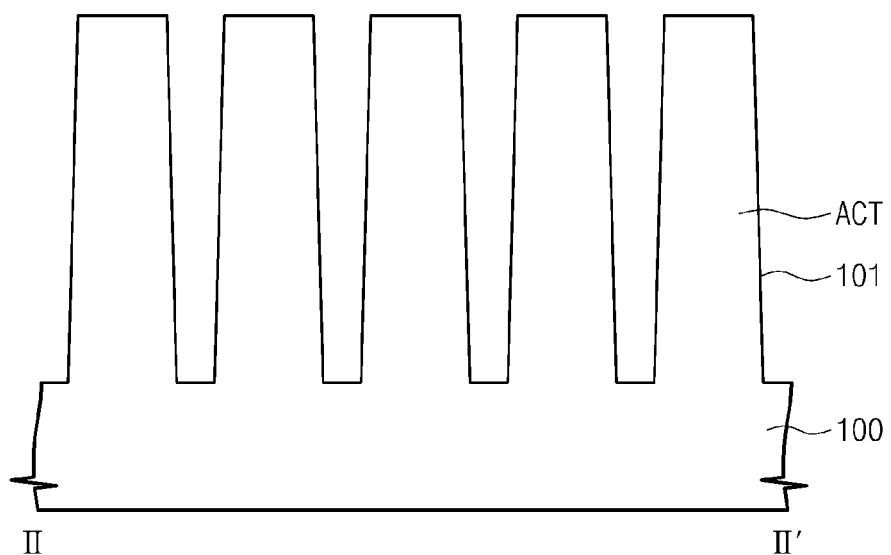
Figure 5C:
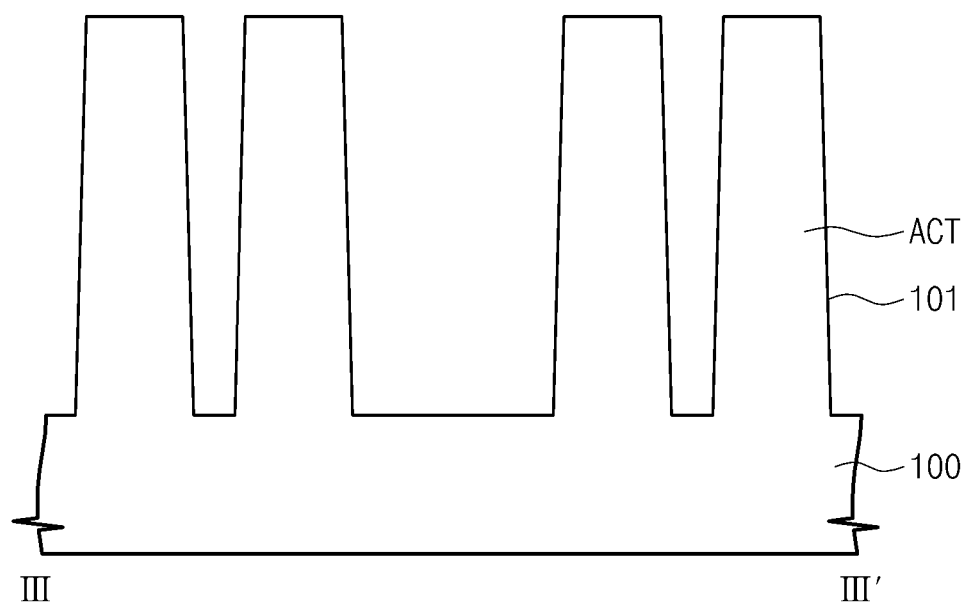
Figure 6A:
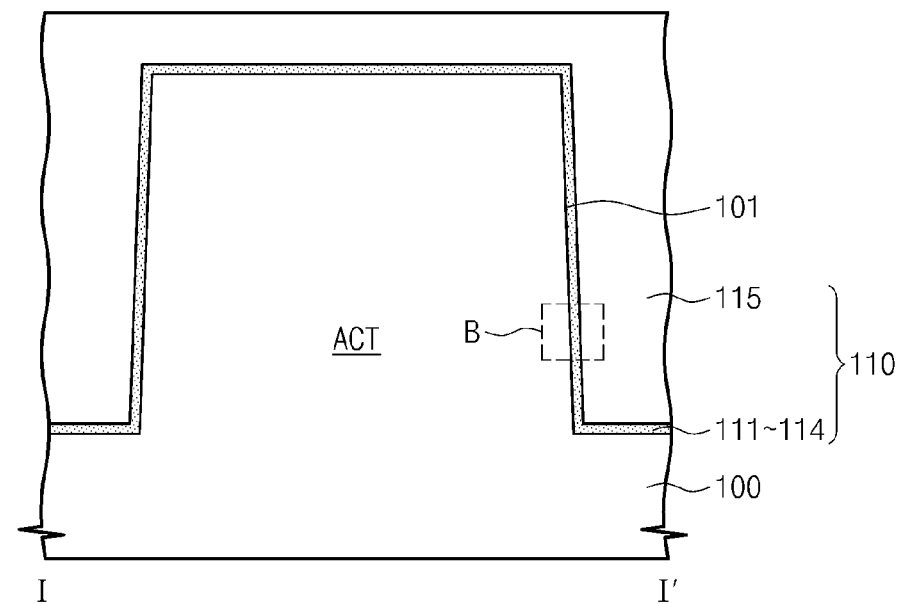
Figure 6B:
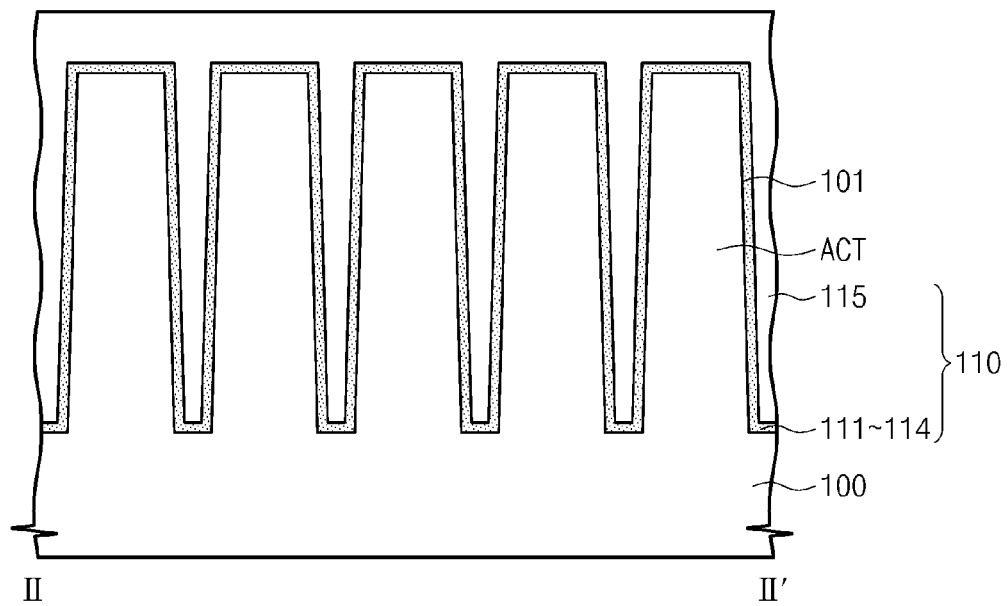
Figure 6C:
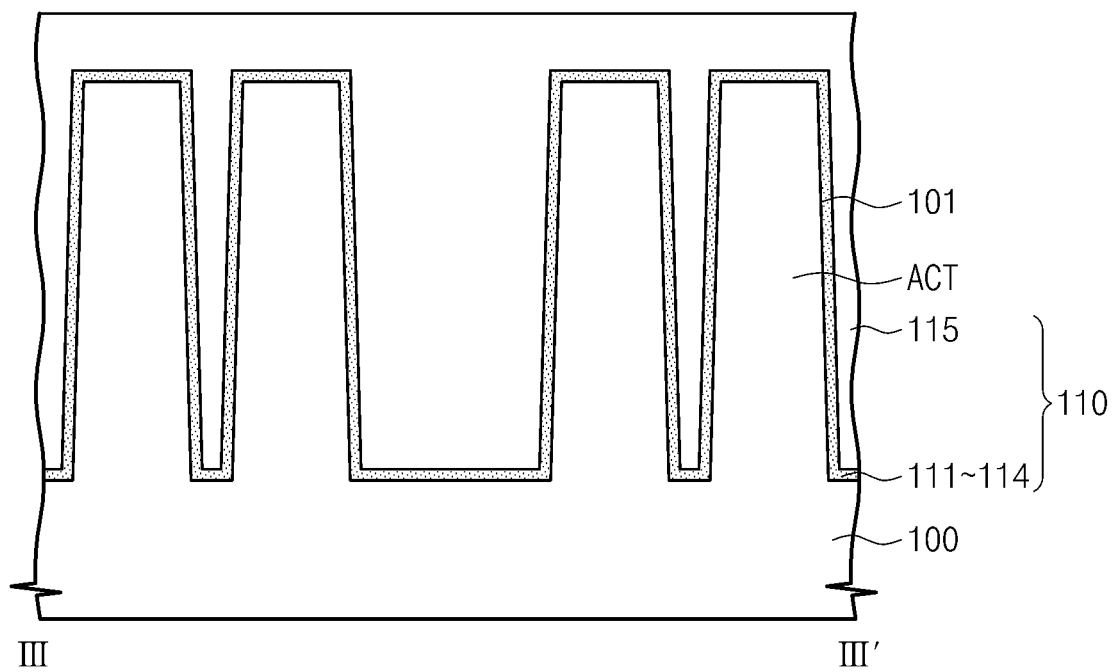

FIG. 1 is a layout diagram of a semiconductor device according to example embodiments of the inventive concept. FIGS. 2A through 2C are sectional views illustrating a semiconductor device according to example embodiments of the inventive concept, taken along lines I-I', and respectively, of FIG. 1. FIG. 3 is a perspective view illustrating active and its neighboring regions of a semiconductor device according to example embodiments of the inventive concept. FIGS. 4A and 4B are enlarged views illustrating portions A and B, respectively, of FIG. 2A.

Referring to FIGS. 1, 2A through 2C, and 3, a substrate 100 may be provided. The substrate 100 may have a first conductivity type (e.g., p-type). The substrate 100 may be, for example, a silicon wafer, a germanium wafer, and/or a silicon-germanium wafer.

A device isolation layer 110 may be provided on the substrate 100 to define an active region ACT. The device isolation layer 110 may be provided in a first trench 101, which may be formed to enclose the active region ACT. For example a trench, that may include the device isolation layer 110, may surround the active region (e.g., by surrounding sidewalls of the active region. The active region ACT may have the first conductivity type (e.g., p-type). When viewed in a plan view, the active region ACT may be shaped like a bar extending along a first direction D1, and the substrate 100 may include a plurality of the active regions ACT that are disposed parallel to each other and/or in line with each other. The active region ACT may be formed to have a fin-shaped structure protruding from a bottom surface of the first trench 101.

A word line WL may be provided on the substrate 100 to cross the active region ACT. For example, the word line WL may extend in a second direction D2 crossing the first direction D1. The word line may cross a plurality of active regions ACT along the second direction D2. Part of the word line WL may be located within the active region below the top surface of the active region ACT to have a top surface lower than that of the active region ACT. Further, two word lines WL may together comprise a word line that includes a first gate electrode G1 and a second gate electrode G2. Hereinafter, in some situations, a word line may be referred to as a "gate electrode." For example, a "gate electrode" may refer to one of the word lines WL depicted in FIG. 1. A word line WL may include at least one of a polysilicon layer, a metal silicide layer, a metal nitride layer, and/or a metal layer. For example, as shown in FIG. 4A, the word line WL may include a metal nitride layer 130a and a metal layer 130b disposed on the metal nitride layer 130a. The metal nitride layer 130a may include at least one of, for example, TiN or WN. The metal layer 130b may include at least one of, for example, W or TiAl. Part of the word line WL may be disposed in a second trench 102 extending parallel to the second direction D2. Part of the second trench 102 may extend over the device isolation layer 110. Another part of the second trench 102 may extend over the active region ACT (e.g., it may extend over a plurality of active regions ACT and the isolation layer 110 formed between the plurality of active regions ACT. The second trench 102 may have a first bottom surface 102a in each active region ACT and a second bottom surface 102b in the device isolation layer 110. In one embodiment, the first bottom surface 102a may be positioned at a higher level than that of the second bottom surface 102b. A gate insulating layer 120 may be provided between the word line WL and the active region ACT. Further, the gate insulating layer 120 may extend to be provided between the word line WL and the device isolation layer 110.

According to the present embodiment, since the word line WL is provided in the second trench 102, a cell transistor therewith may have a recessed channel region. This makes it possible to improve a short channel effect property of the cell transistor and reduce a leakage current of the semiconductor device.

The word line WL may have a top surface that is positioned at a lower level than that of the active region ACT. A first capping pattern 132 may be provided on the word line WL. The first capping pattern 132 may be formed of, for example, at least one selected from the group consisting of a silicon nitride layer, a silicon oxynitride layer, and silicon oxide layer.

A first doped region 104 may be provided in a portion of the active region ACT positioned at a side of a word line WL, and a second doped region 105 may be provided in another portion of the active region ACT positioned at an opposite side of the word line WL. For example, the first doped region 104 may be formed in an edge portion of the active region ACT (also referred to as an end portion in relation to the first direction D1), and the second impurity region 105 may be formed in a central portion of the active region ACT (e.g., between two adjacent word lines WL or between the first and second gate electrode G1 and G2). In one embodiment, the second doped region 105 may have a bottom surface that is positioned at a lower level than that of the first doped region 104. The first and second doped regions 104 and 105 may have a second conductivity type (e.g., n-type).

The metal nitride layer 130a may be formed of or include a material (e.g., TiN) having a mid-gap work-function. In the case where such a material having the mid-gap work-function is used for a gate electrode, the gate electrode may raise a conduction band level (Ec) of the active region ACT therebelow. Here, the conduction band level (Ec) may refer to an energy level of a bottom edge of a conduction band of the active region ACT. For example, a portion of the active region ACT positioned below the gate electrode may have a conduction band level (Ec) that is higher than that of other portions of the active region ACT positioned below the first and second doped regions 104 and 105. Such a difference or slope in the conduction band level (Ec) may result in an unexpected behavior of a transistor. For example, in the case where one of two adjacent transistors in an off state is turned on, electrons may be moved from the turned-on transistor into the off transistor adjacent thereto, due to the difference or slope in the conduction band level (Ec). Therefore, the difference or slope in the conduction band level (Ec) may cause an unintended movement of electrons from the turned-on transistor to the neighboring off transistor, and this may lead to deterioration in operational uniformity and reliability of a semiconductor device. In particular, for memory devices, this phenomenon may lead to a technical issue such as data disturbance. Especially, in the case where impurities are diffused from the first and second doped regions 104 and 105, which have the second conductivity type and a high impurity concentration, into the active region ACT of the first conductivity type, the active region ACT may have a lowered effective impurity concentration, and thus, the data disturbance may be more intensified. To overcome this issue, a process may be performed in such a way that the active region ACT can have a higher impurity concentration. However, owing to a scaling-down of a semiconductor device, there is an upper limitation to the impurity concentration of the active region ACT.

In example embodiments, as shown in FIG. 4A, the gate insulating layer 120 may include a silicon oxide (e.g., $SiO_2$) layer 122 (herein referred to at times as a "fourth silicon layer") on an inner surface of the second trench 102 and a second metal oxide layer 124 on the fourth silicon oxide layer 122. These different layers may be referred to as sub-layers. The silicon oxide layer 122 may be conformally formed on and may contact a surface of the active region ACT in the trench. The second metal oxide layer 124 may have an area oxygen density (i.e., the number of oxygen atoms per unit area) that is lower than that of $SiO_2$. In one embodiment, the second metal oxide layer 124 may contain, for example, at least one of La, Lu, Y, or Gd. The number or density of oxygen atoms may be smaller in the second metal oxide layer 124 than in the fourth silicon oxide layer 122 (e.g., of $SiO_2$).

The difference in amount or density of oxygen atoms may result in structural instability at an interface between the second metal oxide layer 124 and the fourth silicon oxide layer 122, but the structural imbalance may be relaxed by movement of oxygen atoms. For example, oxygen atoms may move from the fourth silicon oxide layer 122 to the second metal oxide layer 124, and such a movement of oxygen atoms may result in occurrence of oxygen vacancies in the fourth silicon oxide layer 122 and an excess of oxygen atoms in the second metal oxide layer 124. Accordingly, the second metal oxide layer 124 may be negatively charged, while the fourth silicon oxide layer 122 may be positively charged. For example, electric dipoles may be produced in the gate insulating layer 120. Due to the presence of the dipoles, the second metal oxide layer 124 may have an elevated energy band structure at or near the interface between the fourth silicon oxide layer 122 and the second metal oxide layer 124. The difference in energy band structure between the second metal oxide layer 124 and the gate electrode (i.e., the metal nitride layer) may lead to an elevation of the energy band structure of the gate electrode and consequently a reduction of an effective work function of the gate electrode. Accordingly, the gate electrode may have the effective work function that is substantially equivalent to that of an n-type metal, whose Fermi level is closer to the conduction band of the active region ACT than to the valence band of the active region ACT. By using the dual-layer gate insulating layer 120 such as described above, for example using an upper metal oxide layer and a lower silicon oxide layer, the conduction band level (Ec) of the active region ACT below the second trench 102 may be lowered, compared, for example to a situation where a single-layer gate insulating layer is used, or a combination of a metal oxide layer with a silicon oxide layer is not used, and this makes it possible to relieve or suppress the unintended movement of electric charges from a turned-on transistor to a neighboring off transistor or the afore-described disturbance issue. However, in certain cases, this may result in a lowering of threshold voltage (Vth) of the active region ACT.

To address this issue, in example embodiments, as shown in FIG. 4B, the device isolation layer 110 may include a first silicon oxide layer 111 on an inner surface of the first trench 101, a second silicon oxide layer 113 on the first silicon oxide layer 111, and a first metal oxide layer 112 between the first and second silicon oxide layers 111 and 113. The first silicon oxide layer 111 may be conformally formed on and may contact a surface of the first trench 101 (e.g., the inner surface of the trench). The device isolation layer 110 may further include a silicon nitride layer 114 provided on the second silicon oxide layer 113. The device isolation layer 110 may further include a third silicon oxide layer 115 provided on the silicon nitride layer 114 to fill the remaining space of the first trench 101. As such, the device isolation layer 110 may be described as having a multi-layer liner layer (e.g., layers 111-114, each of which may be referred to as a sub-layer), and a device isolation filler layer (e.g., layer 115 filled with filler material). In one embodiment, the multi-layer liner layer is an interface layer between an active region and the device isolation filler layer. The first metal oxide layer 112 may enclose the active region ACT. The first metal oxide layer 112 may be extended from a bottom surface of the first trench 101 to a level of a top surface of the active region ACT.

The first metal oxide layer 112 may have an area oxygen density (i.e., the number of oxygen atoms per unit area) that is higher than that of the first silicon oxide layer 111 (e.g., of $SiO_2$). The first metal oxide layer 112 may contain, for example, at least one of Al, Ti, Zr, Hf, Ir, Ta, or Mg. For example, the number or density of oxygen atoms may be greater in the first metal oxide layer 112 than in the first silicon oxide layer 111 (e.g., of $SiO_2$). The difference in amount or density of oxygen atoms may result in structural instability at an interface between the first metal oxide layer 112 and the first silicon oxide layer 111, but the structural imbalance may be relaxed by movement of oxygen atoms. For example, oxygen atoms may be moved from the first metal oxide layer 112 to the first silicon oxide layer 111, and such a movement of oxygen atoms may result in occurrence of oxygen vacancies in the first metal oxide layer 112 and an excess of oxygen atoms in the first silicon oxide layer 111. Accordingly, the first metal oxide layer 112 may be positively charged, whereas the first silicon oxide layer 111 may be negatively charged. As a result, a portion of the active region ACT adjacent to the device isolation layer 110 (in particular, the first silicon oxide layer 111) may have an elevated conduction band level (Ec), and thus, the active region ACT may have a raised threshold voltage (Vth). As such, it is possible to raise the threshold voltage (Vth) of the active region ACT, compared to a situation where the first metal oxide layer 112 is not used as part of a multi-layer interface between the active region ACT and a device isolation layer filling material, without performing a process of doping the active region ACT with impurities of the first conductivity type. Thus, the usage of the device isolation layer 110 of FIG. 4B, particularly including the multi-layer interface layer, makes it possible to prevent a reduction in threshold voltage (Vth) of a transistor, which may occur when the second metal oxide layer 124 is included in the gate insulating layer 120.

In other example embodiments, a negatively-charged layer, instead of the first metal oxide layer 112, may be formed. The negatively-charged layer may contain, for example, Cl or F. For example, it may comprise a base material such as silicon oxide (e.g., $SiO_2$), and may include an impurity such as Cl or F. In this case, the negative charge may lead to an elevation of the conduction band level (Ec) of the active region ACT adjacent to the device isolation layer 110, and this may result in an increase in threshold voltage (Vth) of the active region ACT. As such, in one embodiment, the gate insulating layer includes a sub-layer that reduces an effective work function of the gate electrode and lowers the threshold voltage of the active region, and the interface layer includes a sub-layer that counteracts the threshold voltage reduction of the gate insulating layer, for example, by increasing the threshold voltage.

A first interlayered insulating layer 140 may be provided on the substrate 100 with the first capping pattern 132. The first interlayered insulating layer 140 may include a silicon oxide layer. A bit line BL may be provided on the first interlayered insulating layer 140 and extend parallel a third direction D3 crossing the first and second directions D1 and D2. The bit line BL may be formed of a metal-containing layer. The bit line BL may be electrically connected to the second doped region 105 via a bit line node contact DC. The bit line node contact DC may be formed of, for example, at least one selected from the group consisting of a metal silicide layer, a poly-silicon layer, a metal nitride layer, and a metal layer. The bit line node contact DC may penetrate the first interlayered insulating layer 140. A second capping pattern 142 may be provided on the bit line BL. The second capping pattern 142 may be formed of, for example, at least one selected from the group consisting of a silicon nitride layer, a silicon oxynitride layer, and a silicon oxide layer. A spacer 144 may be provided on sidewalls of the bit line BL and the second capping pattern 142. The spacer 144 may be formed of, for example, at least one selected from the group consisting of a silicon nitride layer, a silicon oxynitride layer, and silicon oxide layer.

A second interlayered insulating layer 150 and an etch stop layer 152 may be provided to cover the bit line BL. The second interlayered insulating layer 150 may include a silicon oxide layer. The etch stop layer 152 may be formed of, for example, at least one selected from the group consisting of a silicon nitride layer, a silicon oxynitride layer, and silicon oxide layer. A storage node contact BC may penetrate the etch stop layer 152, the second interlayered insulating layer 150, and the first interlayered insulating layer 140 and may be in contact with the first doped region 104. The storage node contact BC may be formed of, for example, at least one selected from the group consisting of a metal silicide layer, a poly-silicon layer, a metal nitride layer and a metal layer.

A memory element ME may be provided on the etch stop layer 152. In example embodiments, in the case where the semiconductor device is a dynamic random access memory (DRAM) device, the memory element ME may be a capacitor CP. In other example embodiments, the memory element ME may be or include a magnetic tunnel junction (MTJ) for a magnetic random access memory (MRAM) device, a phase changeable material for a phase-changeable random access memory (PRAM) device, or a variable resistance material for a resistive random access memory (RRAM) device.

FIGS. 5A through 14A are sectional views, which sequentially illustrate a process of fabricating a semiconductor device according to example embodiments of the inventive concept, and each of which is taken along a direction corresponding to line I-I' of FIG. 1. FIGS. 5B through 14B are sectional views, which sequentially illustrate a process of fabricating a semiconductor device according to example embodiments of the inventive concept, and each of which is taken along a direction corresponding to line II-IP of FIG. 1. FIGS. 5C through 14C are sectional views, which sequentially illustrate a process of fabricating a semiconductor device according to example embodiments of the inventive concept, and each of which is taken along a direction corresponding to line of FIG. 1.

Referring to FIGS. 1, 5A, 5B, 5C, 6A, 6B, and 6C, the device isolation layer 110 may be formed on the substrate 100 to define the active region ACT. The substrate 100 may have a first conductivity type (e.g., p-type). The substrate 100 may be, for example, a silicon wafer, a germanium wafer, and/or a silicon-germanium wafer.

The device isolation layer 110 may be formed, for example, using a shallow trench isolation (STI) process. Hereinafter, the formation of the device isolation layer 110 will be described in more detail. The first trench 101 may be formed in the substrate 100 using a first mask pattern (not shown). Accordingly, the active region ACT may be enclosed by the first trench 101 and may be a fin-shaped structure protruding from a bottom surface of the first trench 101. When viewed in a plan view, the active region ACT may be shaped like a bar extending along the first direction D1, and the substrate 100 may include a plurality of the active regions ACT that are disposed some parallel to each other and/or in line with each other. The device isolation layer 110 may be formed in the first trench 101.

Referring back to FIG. 4B, the device isolation layer 110 may include the first silicon oxide layer 111 (e.g., of $SiO_2$), the first metal oxide layer 112, the second silicon oxide layer 113 (e.g., $SiO_2$), the silicon nitride layer 114, and the third silicon oxide layer 115, which are sequentially formed on an inner surface of the first trench 101. The first silicon oxide layer 111 may be formed, for example, using an atomic layer deposition (ALD) process and/or a thermal oxidation process and in one embodiment may have a thickness of about 30 Å. The first metal oxide layer 112 may be formed, for example, using an atomic layer deposition (ALD) process and in one embodiment may have a thickness of about 10 Å. The first metal oxide layer 112 may include, for example, at least one of Al, Ti, Zr, Hf, Ir, Ta, or Mg. The area oxygen density (i.e., the number of oxygen atoms per unit area) of the first metal oxide layer 112 may be higher than that of the first silicon oxide layer 111. For example, the number or density of oxygen atoms may be greater in the first metal oxide layer 112 than in the first silicon oxide layer 111. The second silicon oxide layer 113 may be formed, for example, using an atomic layer deposition (ALD) process and in one embodiment may have a thickness of about 100 Å. The silicon nitride layer 114 may be formed on the second silicon oxide layer 113. In one embodiment, the silicon nitride layer 114 may have a thickness of about 200 Å. The third silicon oxide layer 115 may be formed on the silicon nitride layer 114 to fill the first trench 101. The third silicon oxide layer 115 may be formed, for example, of an oxide-based material (e.g., TOSZ or SOG) having a good gap-fill property.

Figure 7A:
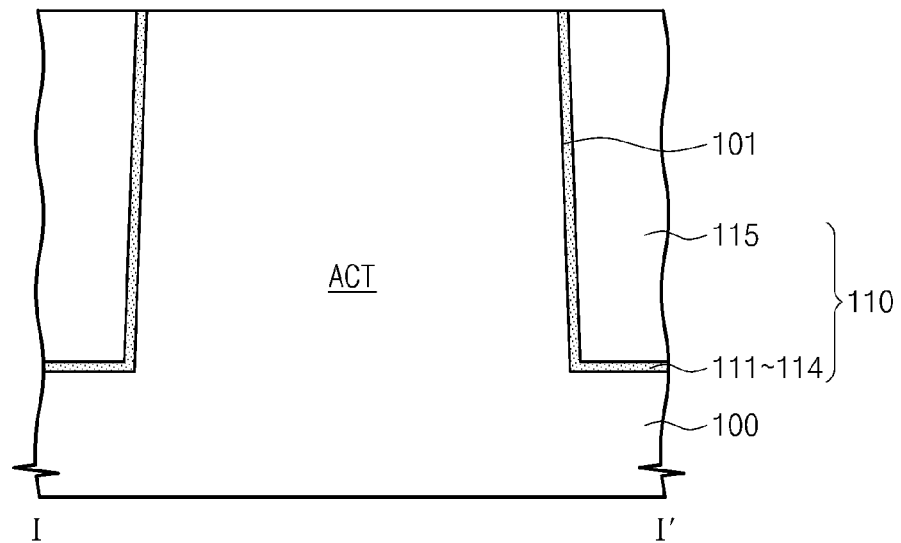
Figure 7B:
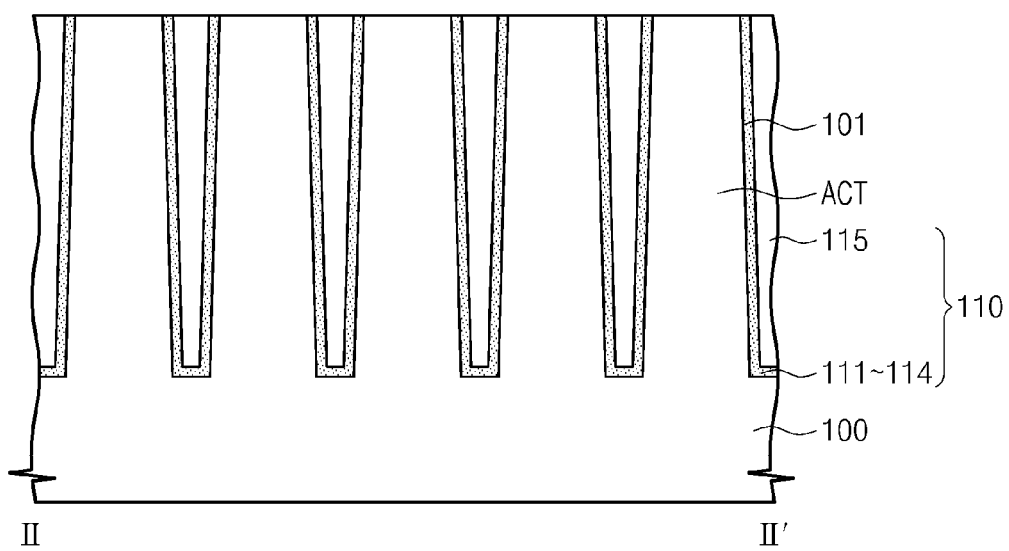
Figure 7C:
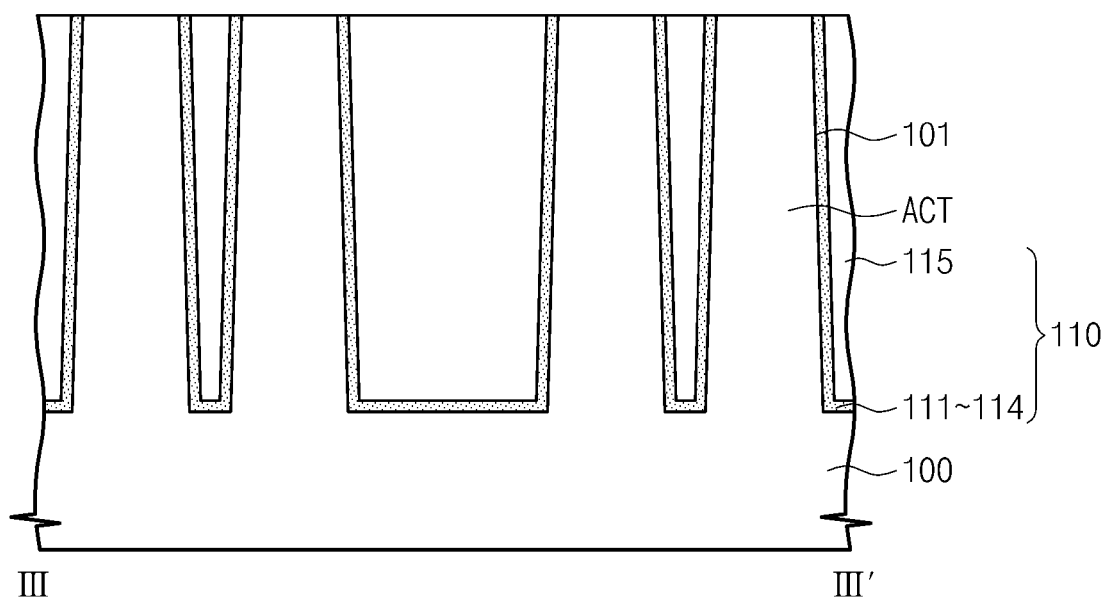
Figure 8A:
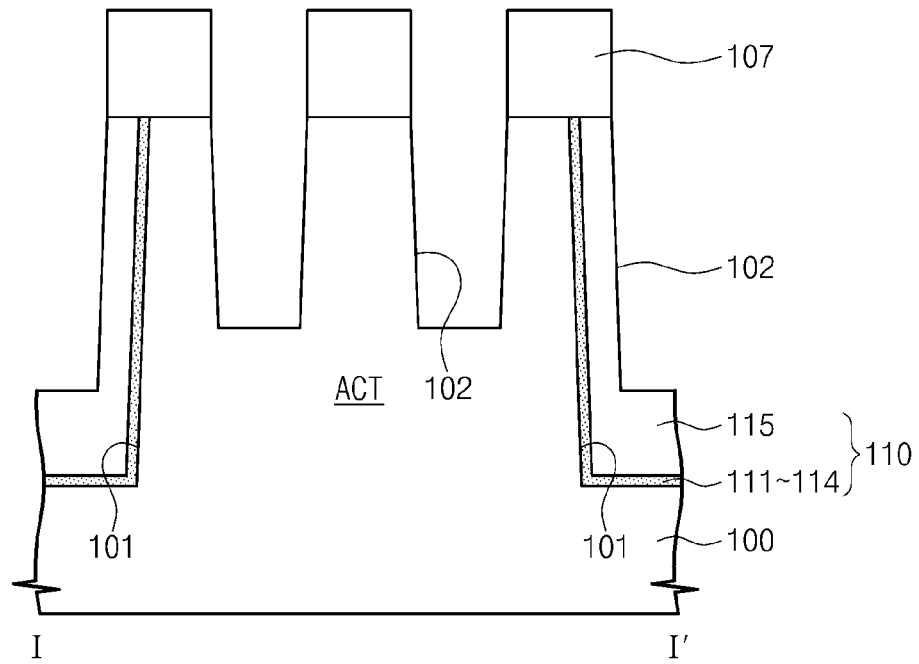
Figure 8B:
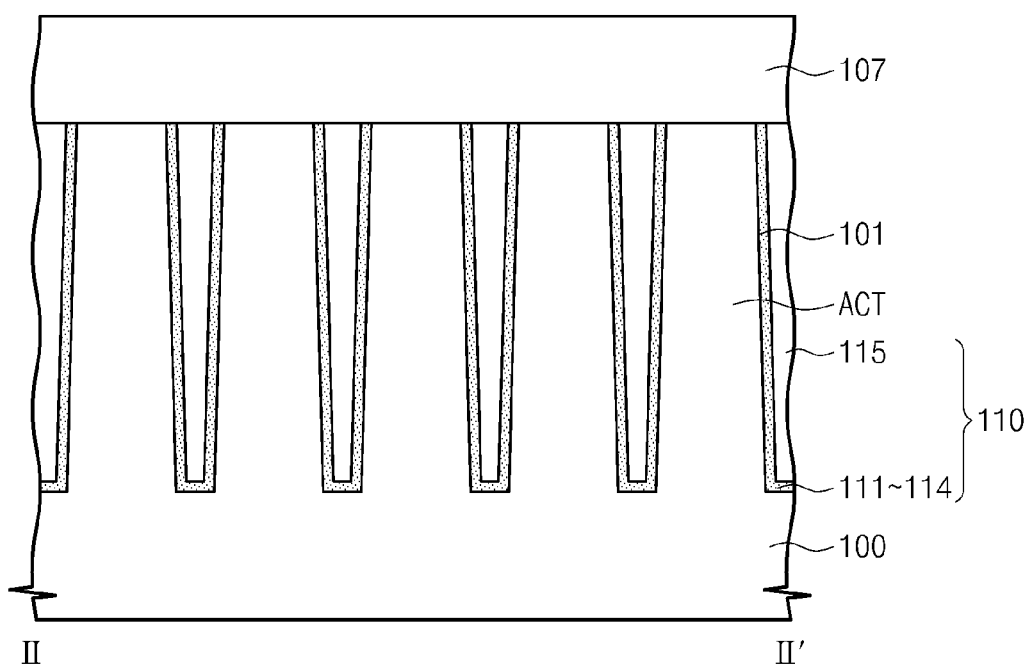
Figure 8C:
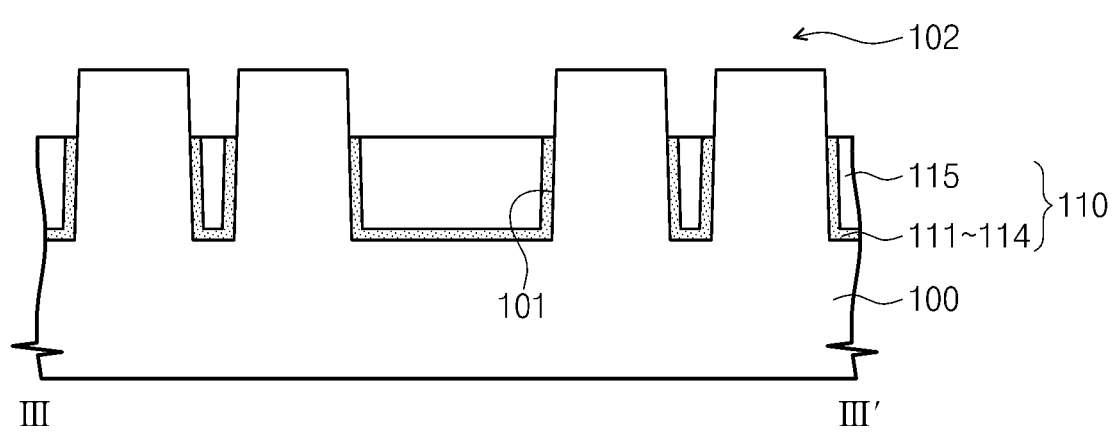
Figure 9A:
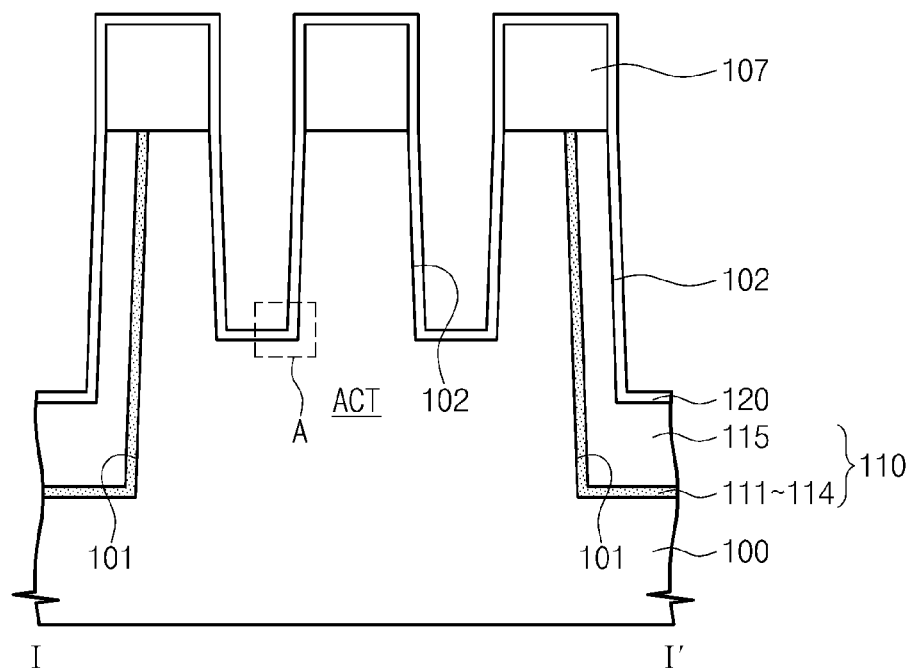
Figure 9B:
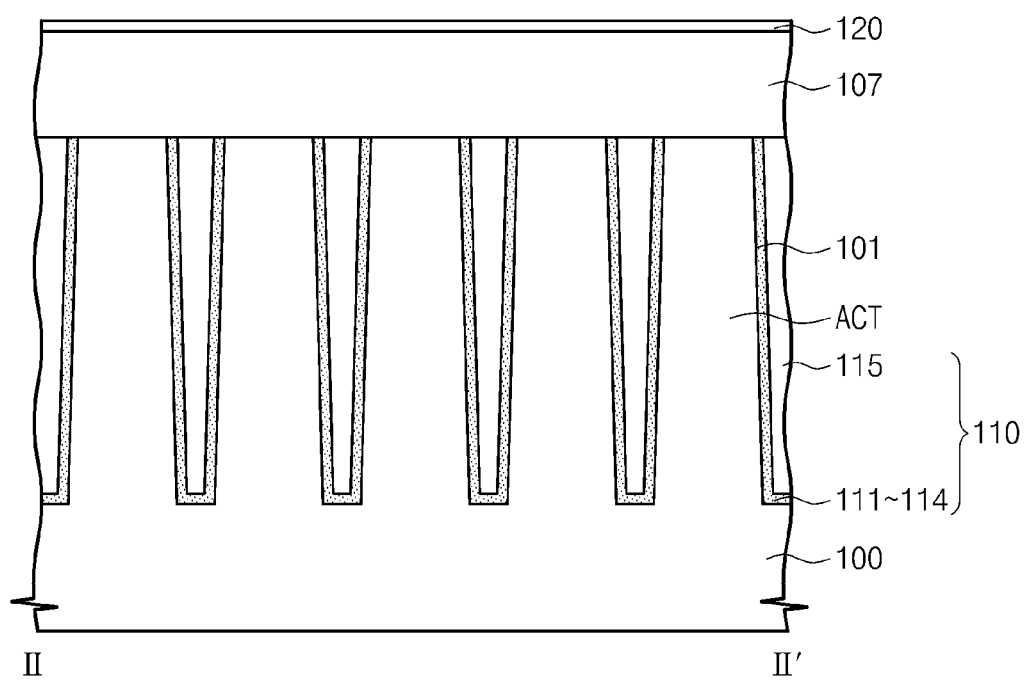
Figure 9C:
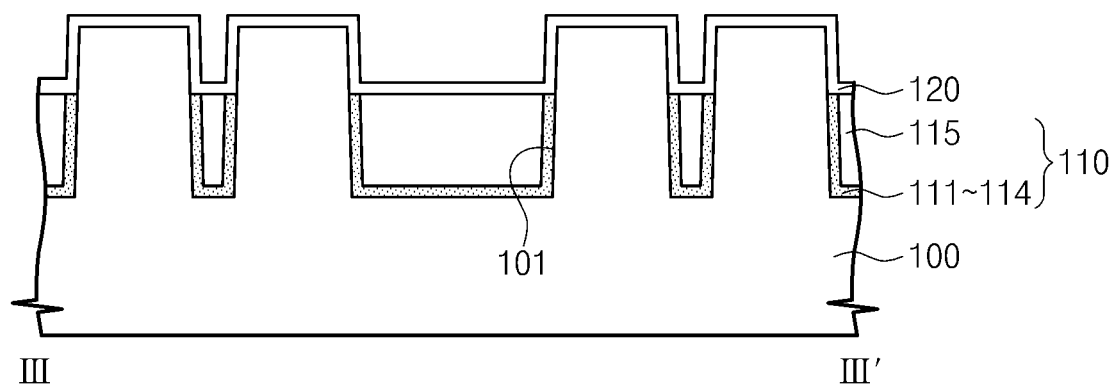
Figure 10A:
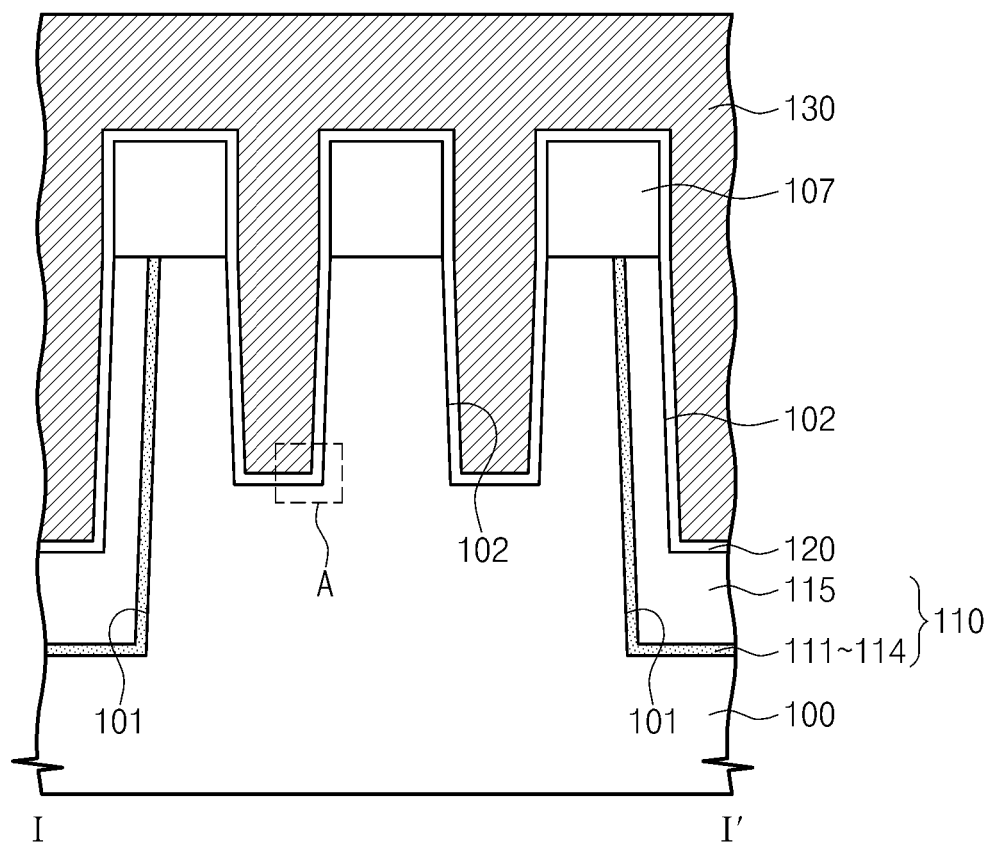
Figure 10B:
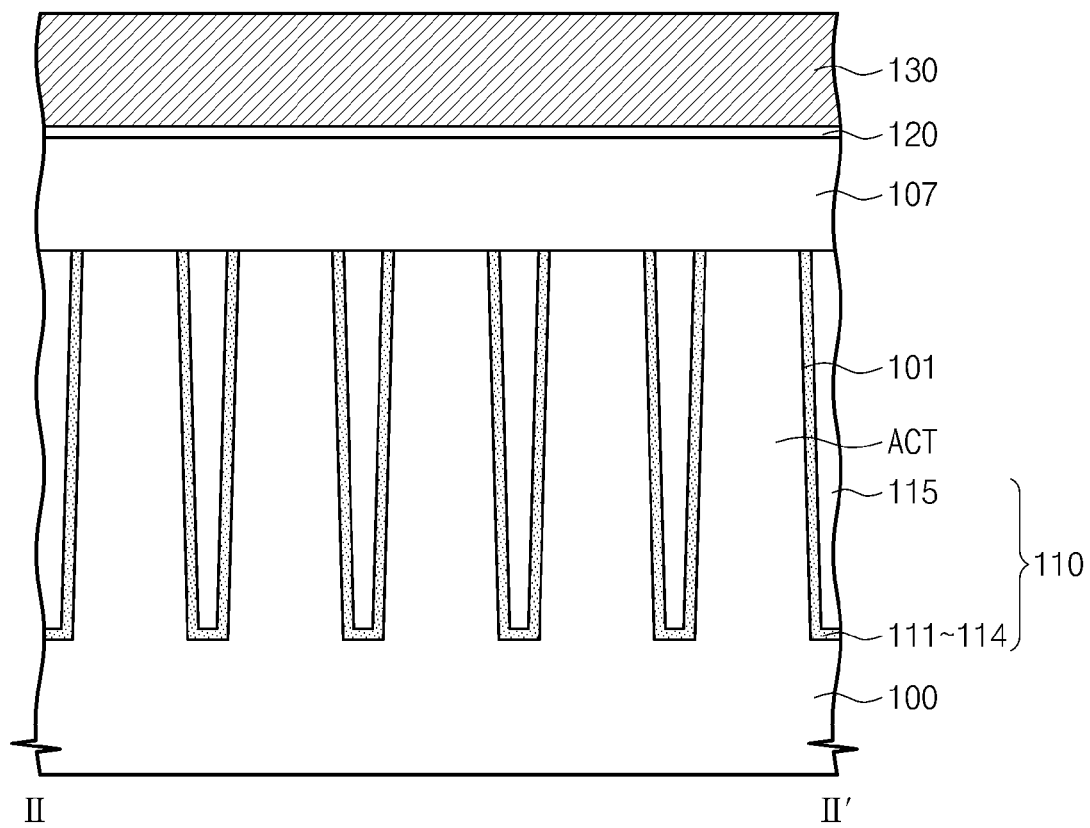
Figure 10C:
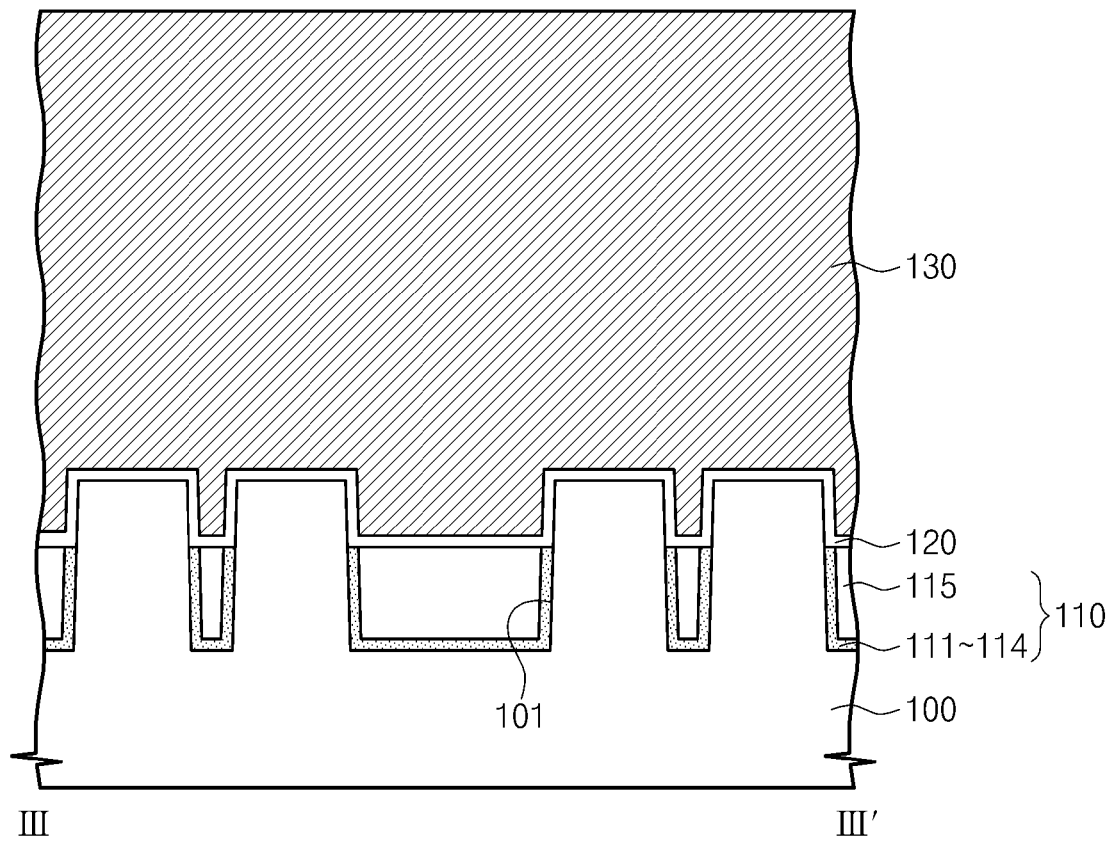

Referring to FIGS. 7A, 7B, and 7C, the device isolation layer 110 may be etched to expose the active region ACT. For example, the etching of the device isolation layer 110 may include a chemical-mechanical polishing (CMP) process and/or a wet etching process.

Referring to FIGS. 1, 8A, 8B, and 8C, the second trench 102 may be formed, for example using a second mask pattern 107 as an etch mask. The second trench 102 may be formed to have a depth smaller than that of the first trench 101. The second trench 102 may be formed in the substrate 100 to cross the active region ACT or extend parallel to the second direction D2. The second direction D2 may cross the first direction D1. In example embodiments, a pair of second trenches 102 may be formed to cross each active region ACT.

Referring to FIGS. 4A, 9A, 9B, and 9C, the gate insulating layer 120 may be formed on an inner surface of the second trench 102. In one embodiment, the gate insulating layer 120 may include a dual-layer structure, such as the fourth silicon oxide layer 122 and the second metal oxide layer 124 provided on the fourth silicon oxide layer 122. The dual-layer structure may be conformally formed to cover the second trench. The fourth silicon oxide layer 122 may be formed for example using an atomic layer deposition (ALD) process. The fourth silicon oxide layer 122 may have a thickness, for example, of about 100 Å. The second metal oxide layer 124 may include, for example, at least one of La, Lu, Y, or Gd. In one embodiment, the second metal oxide layer 124 may be formed to have an area oxygen density lower than that of the fourth silicon oxide layer 122 (e.g., of $SiO_2$). For example, the number or density of oxygen atoms may be smaller in the second metal oxide layer 124 than in the fourth silicon oxide layer 122 (e.g., of $SiO_2$). In one embodiment, the formation of the second metal oxide layer 124 may include forming a second metal layer using, for example, a sputtering method, and then performing a thermal treatment process or an oxidation process on the second metal layer. The second metal oxide layer 124 may have a thickness, for example, of about 5 Å.

Referring to FIGS. 4A, 10A, 10B, and 10C, a gate layer 130 may be formed on the gate insulating layer 120. The gate layer 130 may include at least one of a polysilicon layer, a metal nitride layer, and/or a metal layer. For example, the gate layer 130 may include the metal nitride layer 130a and the metal layer 130b provided on the metal nitride layer 130a. As an example, the metal nitride layer 130a may include at least one of TiN or WN, and the metal layer 130b may include at least one of W or TiAl.

Figure 11A:
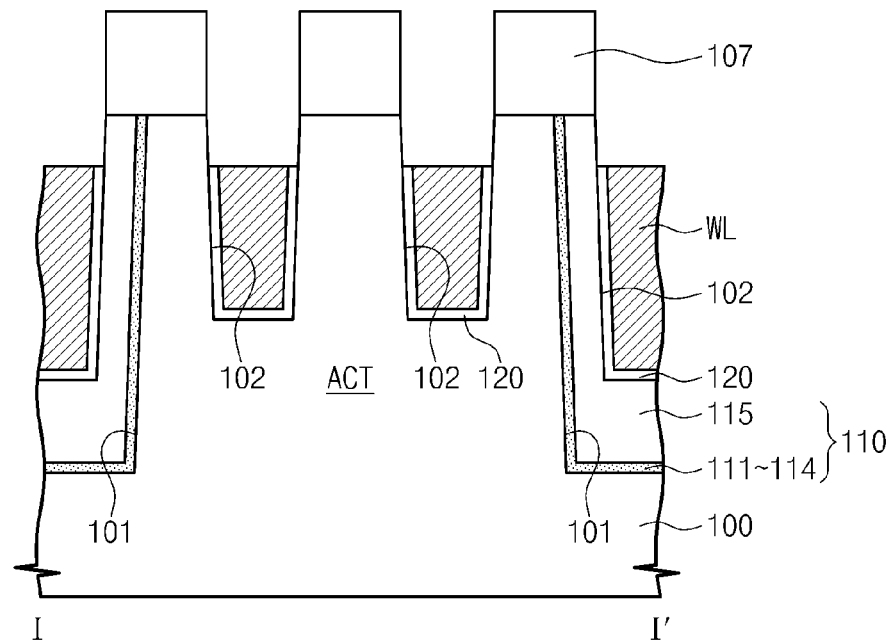
Figure 11B:
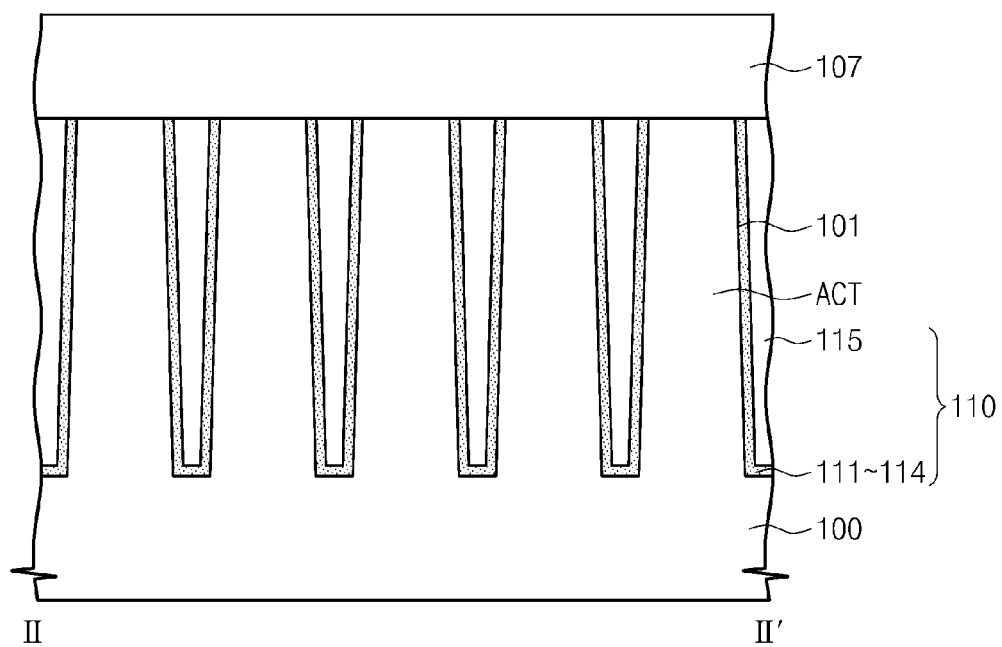
Figure 11C:
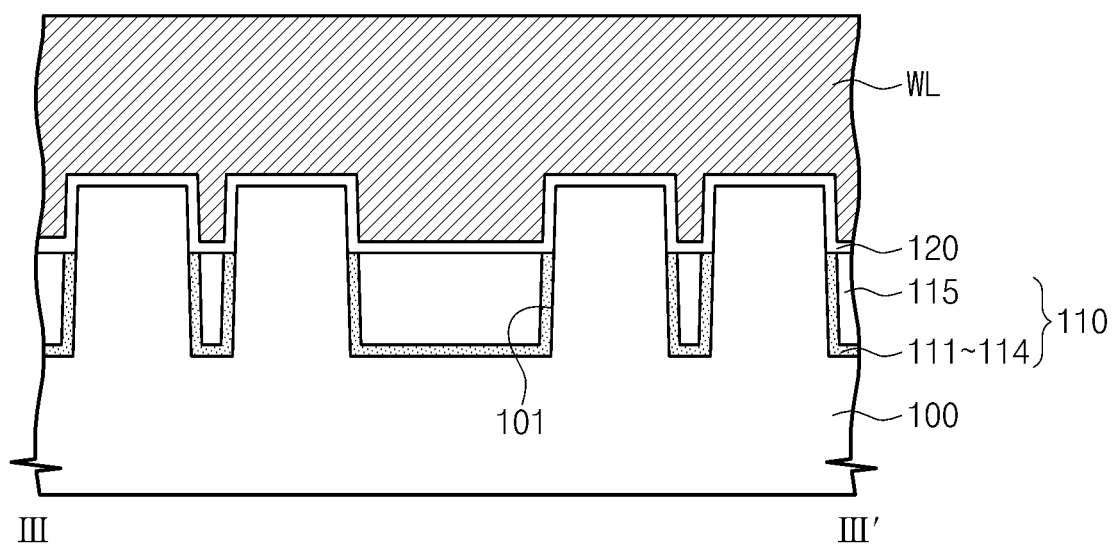

Referring to FIGS. 11A, 11B, and 11C, the gate layer 130 may be recessed to form the word line WL. The word line WL may be formed in such a way that a top surface thereof is lower than that of the active region ACT.

Figure 12A:
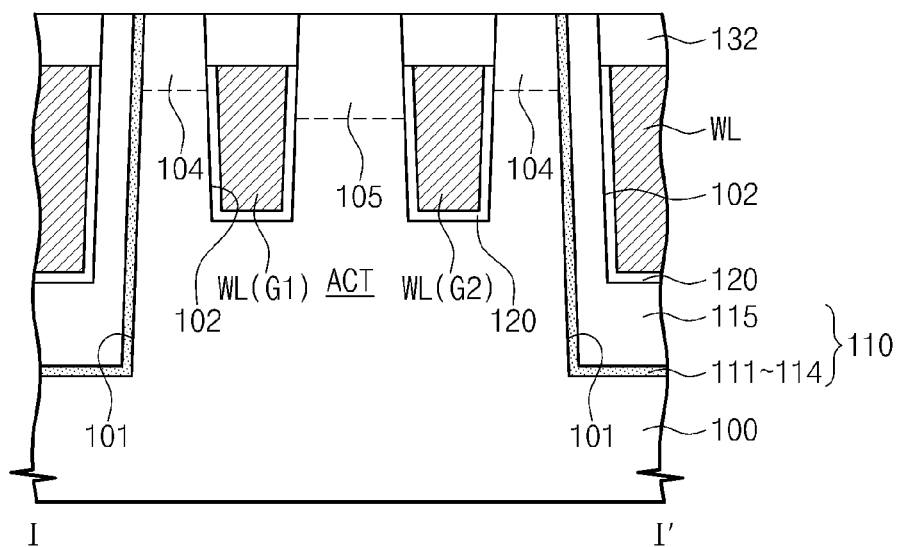
Figure 12B:
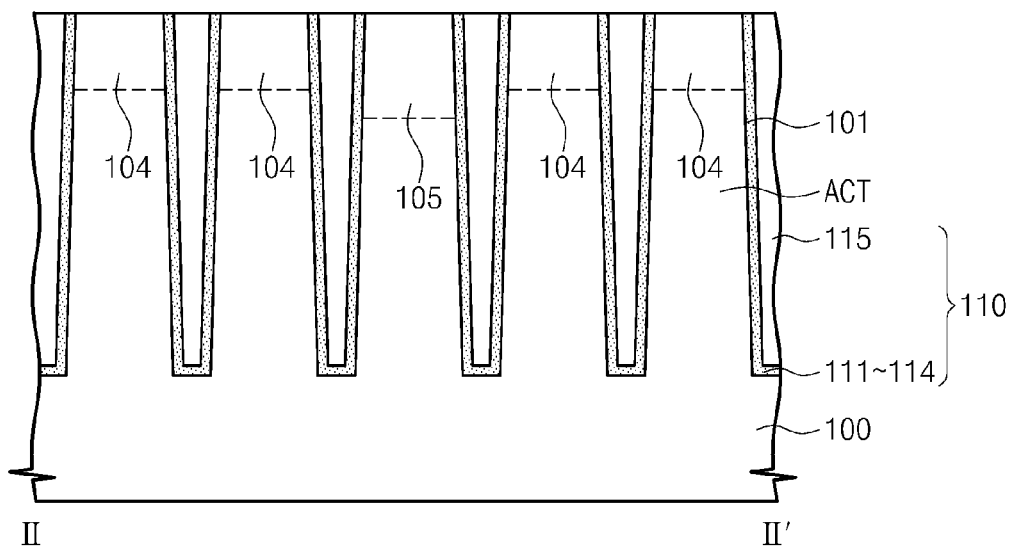
Figure 12C:
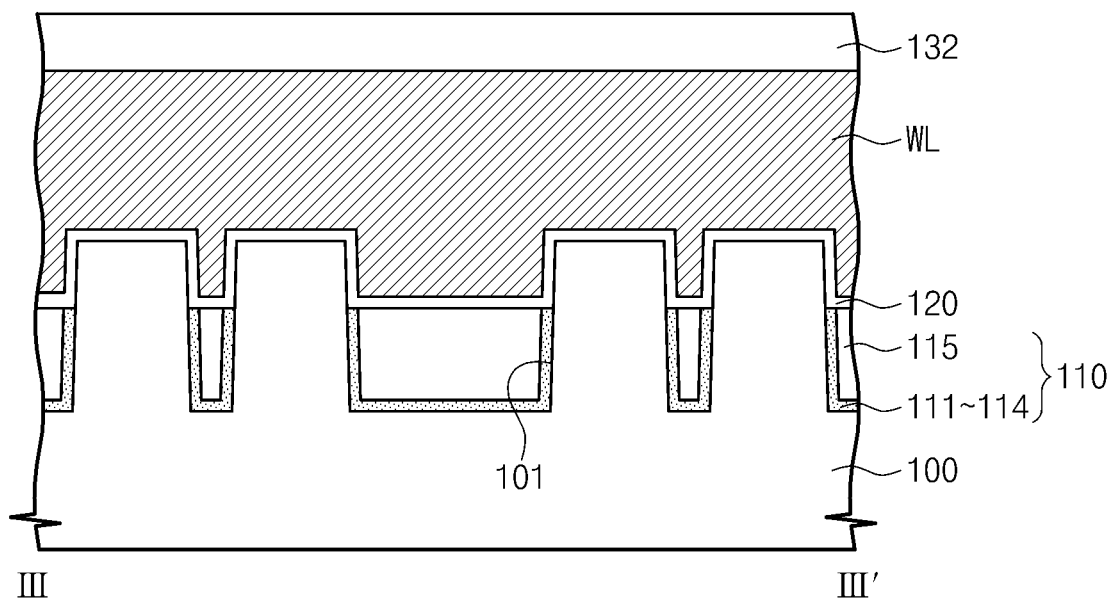

Referring to FIGS. 12A, 12B, and 12C, the first capping pattern 132 may be formed on the word line WL. The first capping pattern 132 may be formed of, for example, at least one selected from the group consisting of a silicon nitride layer, a silicon oxynitride layer, and silicon oxide layer. In one embodiment, the formation of the first capping pattern 132 may include forming a first capping layer (not shown) on the substrate 100 and planarizing the first capping layer to expose the active region ACT. During the formation of the first capping pattern 132, the second mask pattern 107 may be removed to expose the top surface of the active region ACT. The first capping pattern 132 may be formed to have a top surface coplanar with that of the active region ACT.

A doping process using the first capping pattern 132 as an implantation mask may be performed to inject impurities into the active region ACT. Accordingly, the first doped region 104 may be formed in a portion of the active region ACT positioned at a first side of the word line WL, and the second doped region 105 may be formed in another portion of the active region ACT positioned at a second, opposite side of the word line WL. For example, the first doped region 104 may be formed in an edge portion of the active region ACT, and the second doped region 105 may be formed in a central portion of the active region ACT (e.g., between two adjacent word lines WL or between the first and second gate electrode G1 and G2). The first and second doped regions 104 and 105 may be formed to have the second conductivity type (e.g., n-type). In certain embodiments, the second doped region 105 may be formed to have a bottom surface lower than that of the first doped region 104. For this, the second doped region 105 may be formed using an additional doping process or using an implantation mask from different that for the first doped region 104.

Figure 13A:
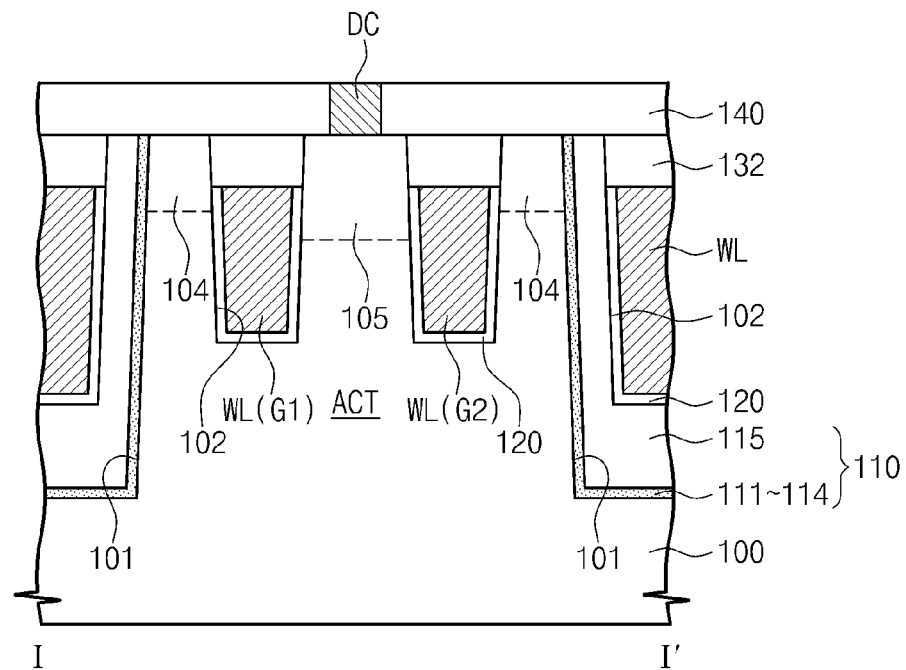
Figure 13B:
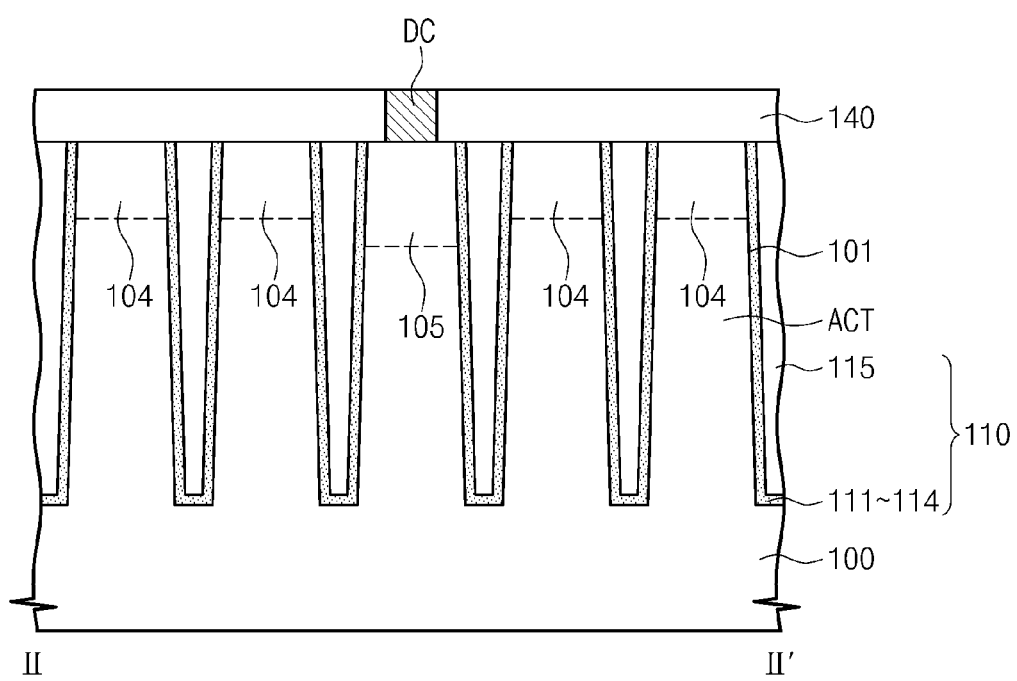
Figure 13C:
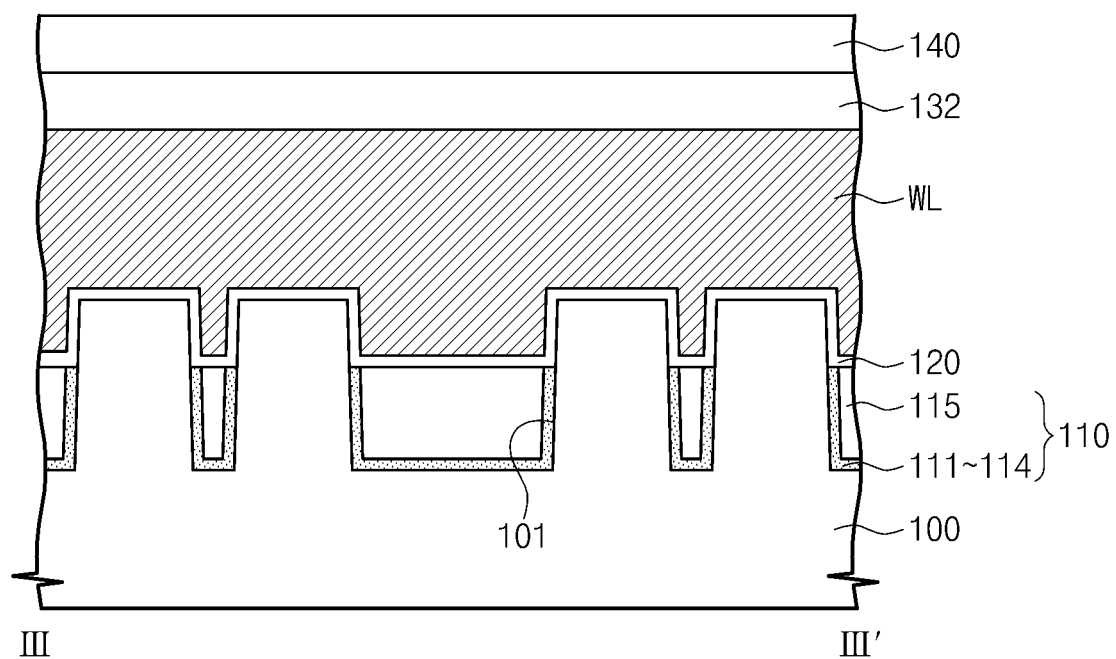
Figure 14A:
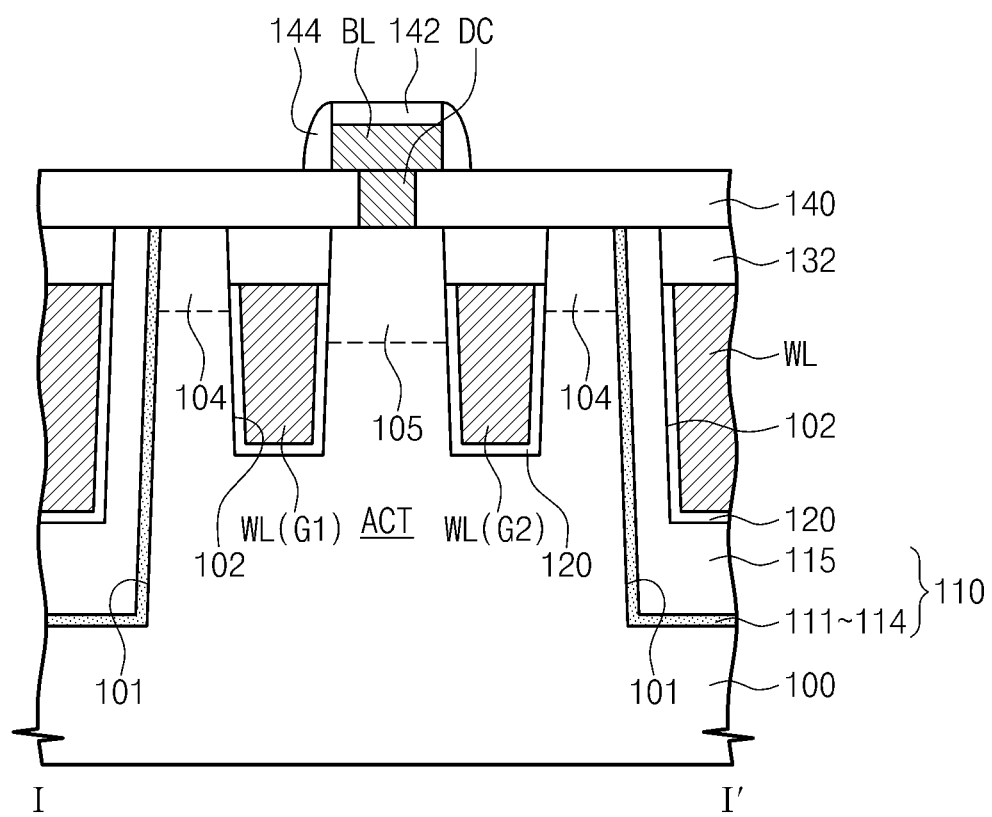
Figure 14B:
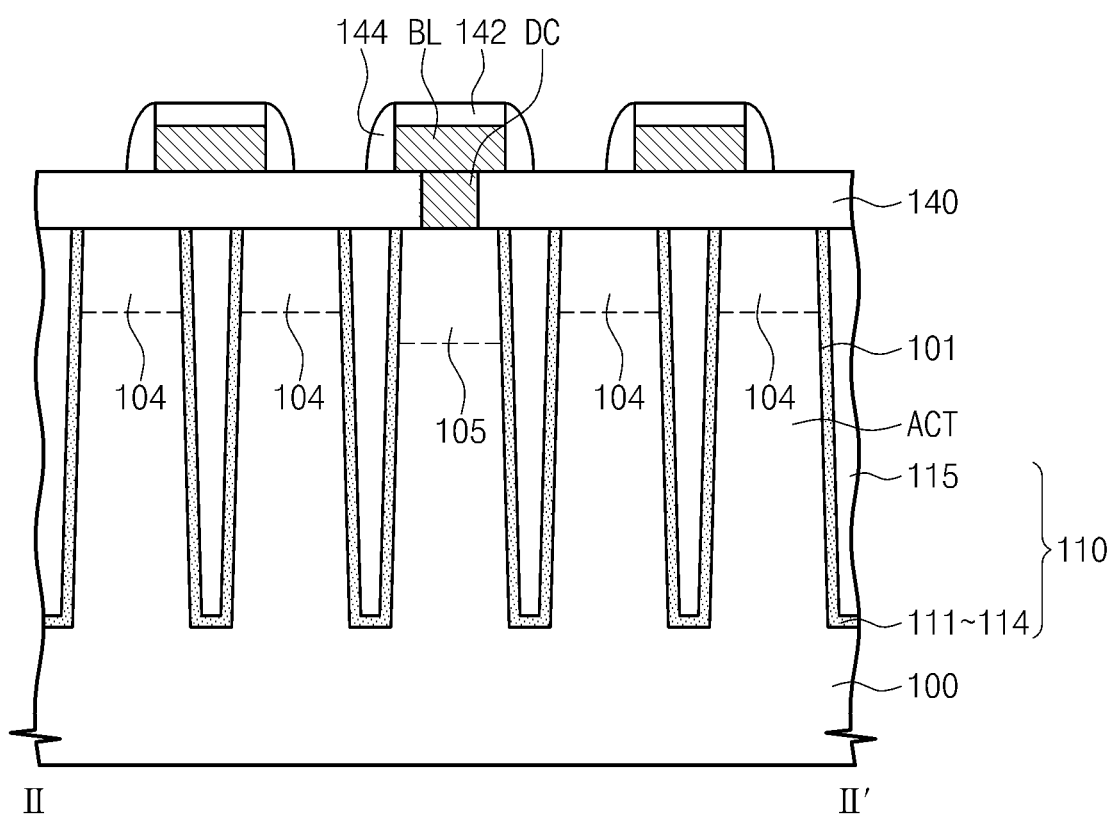
Figure 14C:
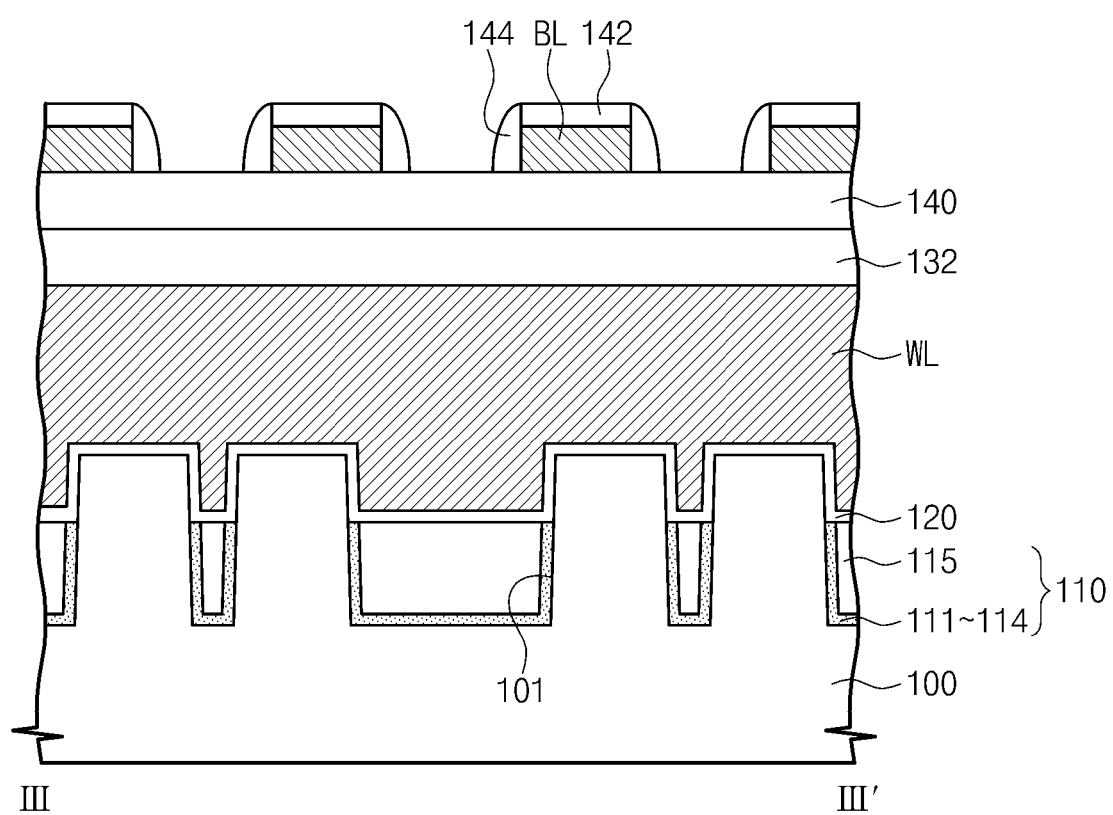

Referring to FIGS. 13A, 13B, and 13C, the first interlayered insulating layer 140 may be formed on the substrate 100. For example, the first interlayered insulating layer 140 may be a silicon oxide layer. The bit line node contact DC may be formed to penetrate the first interlayered insulating layer 140 and be connected to the second doped region 105. The bit line node contact DC may be formed of, for example, at least one selected from the group consisting of a metal silicide layer, a poly-silicon layer, a metal nitride layer, and a metal layer.

Referring to FIGS. 1, 14A, 14B, and 14C, the bit line BL may be formed on the first interlayered insulating layer 140. The bit line BL may be formed, for example, of a metal-containing layer. The bit line BL may extend parallel to the third direction D3 and/or may be disposed to cross both the first and second directions D1 and D2. The bit line BL may be electrically connected to the second doped region 105 through the bit line node contact DC. The formation of the bit line BL may include sequentially forming a bit line conductive layer (not shown) and the second capping pattern 142 on the substrate 100 and patterning the bit line conductive layer using the second capping pattern 142 as an etch mask. The second capping pattern 142 may be formed of, for example, at least one selected from the group consisting of a silicon nitride layer, a silicon oxynitride layer, and a silicon oxide layer. The spacer 144 may be formed on sidewalls of the bit line BL and the second capping pattern 142. The spacer 144 may be formed of, for example, at least one selected from the group consisting of a silicon nitride layer, a silicon oxynitride layer, and a silicon oxide layer.

Referring back to FIGS. 2A, 2B, and 2C, the second interlayered insulating layer 150 and the etch stop layer 152 may be formed to cover the bit line BL. The second interlayered insulating layer 150 may include, for example, a silicon oxide layer. The etch stop layer 152 may be formed of, for example, at least one selected from the group consisting of a silicon nitride layer, a silicon oxynitride layer, and a silicon oxide layer. The storage node contact BC may be formed to penetrate the etch stop layer 152, the second interlayered insulating layer 150, and the first interlayered insulating layer 140. The storage node contact BC may be in contact with the first doped region 104. The storage node contact BC may be formed of, for example, at least one selected from the group consisting of a metal silicide layer, a poly-silicon layer, a metal nitride layer, and a metal layer.

The memory element ME may be formed on the etch stop layer 152. In example embodiments, in the case where the semiconductor device is a dynamic random access memory (DRAM) device, the memory element ME may be a capacitor CP. In other example embodiments, the memory element ME may be or include a magnetic tunnel junction (MTJ) for a magnetic random access memory (MRAM) device, a phase changeable material for a phase-changeable random access memory (PRAM) device, or a variable resistance material for a resistive random access memory (RRAM) device.

As used herein, a semiconductor device may refer to any of the various devices such as shown in FIGS. 1-14C above, and may also refer, for example, to an array of transistors or memory cells, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Semiconductor devices according to other example embodiments of the inventive concept will be described below.

As one example, in one embodiment, the gate insulating layer 120 may be formed not to include the second metal oxide layer 124 of the previous embodiments described with reference to FIGS. 2A through 2C. Alternatively, the word line WL may include an n-type metal layer (e.g., of La, Hf, Al, Ta, and so forth). For example, a lower portion of the second trench 102 may be filled with the n-type metal layer.

As another example, in one embodiment, the second metal oxide layer 124 may not be removed from the sidewall of the second trench 102, in the process of recessing the gate layer 130 described with reference to FIGS. 11A, 11B, and 11C. A portion of the second metal oxide layer 124 may remain on the sidewall of the second trench 102 and may have a top that is positioned at a higher level than that the top surface of the word line WL. For example, in certain embodiments, the second metal oxide layer 124 may be extended to cover the top surface of the active region ACT.

Figure 15:
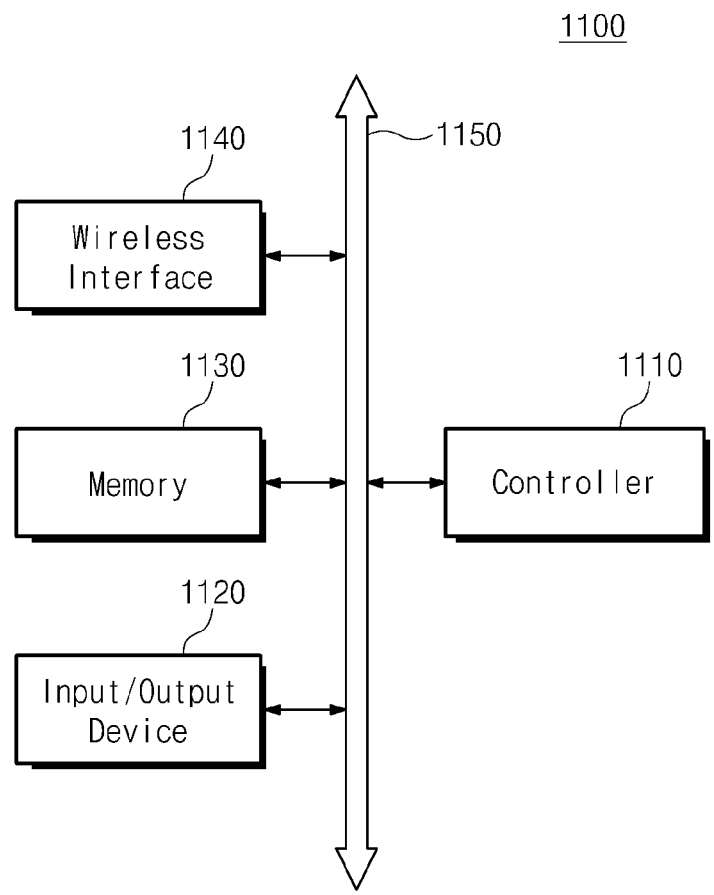
FIG. 15 is a block diagram schematically illustrating an example of electronic devices including a semiconductor device according to example embodiments of the inventive concept.

As another example, in one embodiment, the first metal oxide layer 112 may be locally formed on a lower sidewall of the first trench 101. This structure may be realized by selectively removing an upper portion of the first metal oxide layer 112 in the etching process for forming the second trench 102 described with reference to FIGS. 8A, 8B, and 8C. stopped FIG. 15 is a block diagram schematically illustrating an example of electronic devices including a semiconductor device according to example embodiments of the inventive concept. Referring to FIG. 15, an electronic device 1100 according to example embodiments of the inventive concept may be one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1100 may include a controller 1110, an input/output device (s) 1120 (such as a keypad, a keyboard, a display, etc.), a memory 1130, and/or a wireless interface 1140 that are connected/coupled to each other through a bus 1150. The controller 1110 may include, for example, at least one microprocessor, a digital signal process, a microcontroller, etc. The memory 1130 may be configured to store a command code to be used by the controller 1110 and/or user data. The memory 1130 may include a semiconductor device according to example embodiments of inventive concepts. The electronic device 1100 may use a wireless interface 1140 configured to transmit data to and/or receive data from a wireless communication network using a RF (radio frequency) signal. The wireless interface 1140 may include, for example, an antenna, a wireless transceiver, etc. The electronic system 1100 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Figure 16:
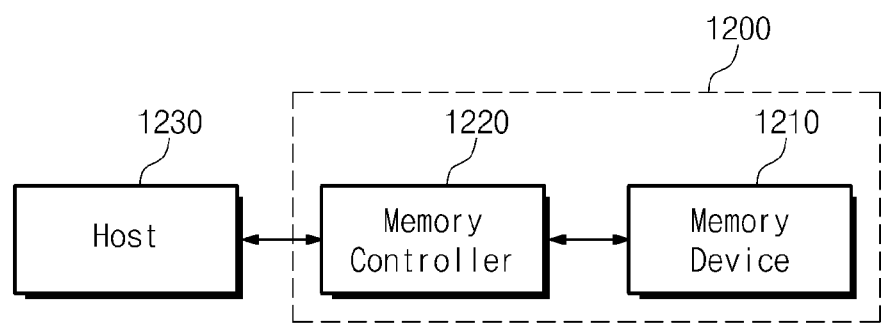
FIG. 16 is a block diagram schematically illustrating an example of memory systems including a semiconductor device according to example embodiments of the inventive concept.

FIG. 16 is a block diagram schematically illustrating an example of memory systems including a semiconductor device according to example embodiments of the inventive concept. Referring to FIG. 16, a memory system including a semiconductor device according to example embodiments of inventive concepts will be described. The memory system 1200 may include a memory device 1210 for storing a relatively large amount of data and a memory controller 1220. The memory controller 1220 controls the memory device 1210 so as to read data stored in the memory device 1210 and/or to write data into the memory device 1210 in response to a read/write request of a host 1230. The memory controller 1220 may include an address mapping table for mapping an address provided from the host 1230 (e.g., a mobile device or a computer system) into a physical address of the memory device 1210. The memory device 1210 may be a semiconductor device according to example embodiments of inventive concept.

According to example embodiments of the inventive concept, it is possible to suppress a data disturbance phenomenon that causes electrons to be moved from an on cell to a neighboring off cell. Accordingly, a semiconductor device can have higher reliability. In addition, a threshold voltage of a cell transistor can be controlled by an amount of electric charges in a device isolation layer, rather than a doping concentration of impurities, and this makes it possible to increase an integration density of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
  a semiconductor substrate comprising an active region defined by a trench, the active region having a first conductivity type;
  a device isolation layer provided in the trench to surround the active region;
  a gate electrode, extending in a direction crossing the active region, and formed on the active region and the device isolation layer; and
  a gate insulating layer between the active region and the gate electrode,
  wherein the gate insulating layer comprises a first silicon oxide layer and a first metal oxide layer on the first silicon oxide layer, and
  wherein the first metal oxide layer has an area oxygen density lower than an area oxygen density of the first silicon oxide layer.

2. The device of claim 1, wherein the first metal oxide layer contains at least one of La, Lu, Y, or Gd.

3. The device of claim 1, wherein the gate electrode comprises a metal nitride layer in contact with the first metal oxide layer, and the metal nitride layer comprises TiN or WN.

4. The device of claim 1, wherein the device isolation layer comprises a second silicon oxide layer on an inner surface of the trench and a second metal oxide layer on the second silicon oxide layer, and
  wherein the second metal oxide layer has an area oxygen density higher than an area oxygen density of the second silicon oxide layer.

5. The device of claim 4, wherein the second metal oxide layer contains at least one of Al, Ti, Zr, Hf, Ir, Ta, or Mg.

6. A semiconductor device, comprising:
  a semiconductor substrate comprising an active region defined by a trench, the active region having a first conductivity type;
  a device isolation layer provided in the trench to surround the active region, the device isolation layer including a device isolation filler layer and an interface layer between the active region and the device isolation filler layer;
  a gate electrode extending in a direction crossing the active region, and formed on the active region and the device isolation layer; and
  a gate insulating layer between the active region and the gate electrode,
  wherein the gate insulating layer includes a first sub-layer that reduces an effective work function of the gate electrode and lowers the threshold voltage of the active region, and the interface layer includes a second sub-layer that counteracts the threshold voltage reduction of the gate insulating layer.

7. The semiconductor device of claim 6, wherein the first sub-layer is a first metal oxide layer, and the second sub-layer is a second metal oxide layer.

8. The semiconductor device of claim 7, wherein the interface layer includes a silicon oxide layer between the active region and the second metal oxide layer.

9. A semiconductor device, comprising:
a semiconductor substrate comprising an active region defined by a trench;
a device isolation layer provided in the trench to surround the active region;
a gate electrode, extending in a direction crossing the active region, and formed on the active region and the device isolation layer, the gate electrode including a metal nitride layer and a metal layer on the metal nitride layer; and
a gate insulating layer between the active region and the gate electrode, the gate insulating layer including a first metal oxide layer in contact with the metal nitride layer and a first silicon oxide layer between the first metal oxide layer and the active region.

10. The semiconductor device of claim 9, wherein the metal nitride layer comprises TiN or WN, and
wherein the metal layer comprises W or TiAl.

11. The semiconductor device of claim 9, wherein the first metal oxide layer contains at least one of La, Lu, Y, or Gd.

12. The semiconductor device of claim 9, wherein the first metal oxide layer has an area oxygen density lower than an area oxygen density of the first silicon oxide layer.

13. The semiconductor device of claim 9, wherein the first metal oxide layer is negatively charged, and
wherein the first silicon oxide layer is positively charged.

14. The semiconductor device of claim 13, wherein the gate insulating layer has electric dipoles.

15. The semiconductor device of claim 9, wherein the device isolation layer comprises a second silicon oxide layer on an inner surface of the trench and a second metal oxide layer on the second silicon oxide layer.

16. The semiconductor device of claim 15, wherein the second metal oxide layer contains at least one of Al, Ti, Zr, Hf, Ir, Ta, or Mg.

17. The semiconductor device of claim 15, wherein the second metal oxide layer has an area oxygen density higher than an area oxygen density of the second silicon oxide layer.

18. The semiconductor device of claim 15, wherein the second metal oxide layer is positively charged, and
wherein the second silicon oxide layer is negatively charged.

* * * * *